US010361244B2

(12) United States Patent
Takayanagi et al.

(10) Patent No.: US 10,361,244 B2
(45) Date of Patent: Jul. 23, 2019

(54) SOLID-STATE IMAGING DEVICE, METHOD FOR PRODUCING SOLID-STATE IMAGING DEVICE, AND ELECTRONIC APPARATUS

(71) Applicant: Brillnics Inc., Grand Cayman (KY)

(72) Inventors: Isao Takayanagi, Tokyo (JP); Shunsuke Tanaka, Tokyo (JP); Kazuya Mori, Tokyo (JP); Katsuhiko Ariyoshi, Tokyo (JP); Shinichiro Matsuo, Tokyo (JP)

(73) Assignee: BRILLINICS INC., Grand Cayman (KY)

( * ) Notice: Subject to any disclaimer, the term of this patent is extended or adjusted under 35 U.S.C. 154(b) by 0 days.

(21) Appl. No.: 15/325,848

(22) PCT Filed: Jul. 9, 2015

(86) PCT No.: PCT/JP2015/069777
§ 371 (c)(1),
(2) Date: Jan. 12, 2017

(87) PCT Pub. No.: WO2016/009943
PCT Pub. Date: Jan. 21, 2016

(65) Prior Publication Data
US 2017/0162625 A1 Jun. 8, 2017

(30) Foreign Application Priority Data

Jul. 15, 2014 (JP) .................. 2014-145256

(51) Int. Cl.
*H04N 5/372* (2011.01)
*H01L 27/148* (2006.01)
(Continued)

(52) U.S. Cl.
CPC ...... *H01L 27/14812* (2013.01); *H01L 23/481* (2013.01); *H01L 27/1469* (2013.01);
(Continued)

(58) Field of Classification Search
USPC ....................................... 348/317
See application file for complete search history.

(56) References Cited

U.S. PATENT DOCUMENTS

| 5,438,365 A | * | 8/1995 | Yamashita | ......... H04N 5/23245 |
| | | | | 348/297 |
| 6,985,182 B1 | * | 1/2006 | Morinaka | ......... H01L 27/14806 |
| | | | | 257/240 |

(Continued)

FOREIGN PATENT DOCUMENTS

| JP | 2011-204915 A | 10/2011 |
| JP | 2012-204810 A | 10/2012 |
| JP | 2013-90127 A | 5/2013 |

OTHER PUBLICATIONS

International Search Report dated Oct. 13, 2015, issued in counterpart International Application No. PCT/JP2015/069777 (1 page).
Aoki, Jun et al., "A Rolling-Shutter Distortion-Free 3D Stacked Image Sensor with —160dB Parasitic Light Sensitivity In-Pixel Storage Node",IEEE International Solid-State Circuits Conference, 2013, Japan (pp. 482-484).

(Continued)

*Primary Examiner* — Twyler L Haskins
*Assistant Examiner* — Wesley J Chiu
(74) *Attorney, Agent, or Firm* — Westerman, Hattori, Daniels & Adrian, LLP

(57) ABSTRACT

This solid-state imaging device 100 has: a photosensitive part that includes pixel portions 211, which are disposed in a matrix, and charge transfer parts 212 for transferring, by the column, the signal charge of the pixel portions; a plurality of charge storage parts 220 that accumulate the signal charges transferred by the plurality of charge transfer parts of the photosensitive part; a relay part 240 that relays the transfer of the signal charges transferred by the plurality of charge transfer parts to each charge storage part; an output part 230 that outputs the signal charges of the plurality of charge storage parts as electric signals; a first substrate 110 at which the photosensitive unit 210 is formed; and a second substrate 120 at which the charge storage part 220 and (Continued)

output unit 230 are formed. The first substrate and second substrate are stacked together, and the relay part 240 electrically couples the charge transfer parts of the first substrate to the charge storage parts of the second substrate by means of a connecting parts passing through the substrates outside the photosensitive region of the photosensitive part.

12 Claims, 35 Drawing Sheets

(51) Int. Cl.
  *H04N 5/369* (2011.01)
  *H01L 23/48* (2006.01)
  *H01L 27/146* (2006.01)
  *H04N 5/378* (2011.01)

(52) U.S. Cl.
  CPC .... *H01L 27/1485* (2013.01); *H01L 27/14634* (2013.01); *H01L 27/14818* (2013.01); *H01L 27/14837* (2013.01); *H01L 27/14887* (2013.01); *H04N 5/369* (2013.01); *H04N 5/372* (2013.01); *H04N 5/378* (2013.01); *H04N 5/379* (2018.08)

(56) References Cited

U.S. PATENT DOCUMENTS

| | | | |
|---|---|---|---|
| 2006/0220933 A1* | 10/2006 | Yamada | H04N 5/335 341/76 |
| 2008/0042046 A1* | 2/2008 | Mabuchi | H01L 27/14634 250/208.1 |
| 2008/0117322 A1* | 5/2008 | Tokuoka | H01L 27/14837 348/311 |
| 2010/0002121 A1* | 1/2010 | Fujioka | H01L 27/14837 348/314 |
| 2011/0233702 A1 | 9/2011 | Takahashi et al. | |
| 2012/0248580 A1 | 10/2012 | Matsugai et al. | |
| 2013/0092820 A1 | 4/2013 | Takemoto | |
| 2014/0176770 A1* | 6/2014 | Kondo | H01L 27/14634 348/294 |
| 2015/0163403 A1* | 6/2015 | Wakabayashi | H04N 5/378 348/308 |
| 2016/0286146 A1* | 9/2016 | Wirth | H04N 5/378 |
| 2017/0230598 A1* | 8/2017 | Takayanagi | H04N 5/378 |

OTHER PUBLICATIONS

Office Action dated Dec. 25, 2018, issued in counterpart Chinese Application 201580039228.4, with English translation (12 pages).

* cited by examiner

FIG. 7
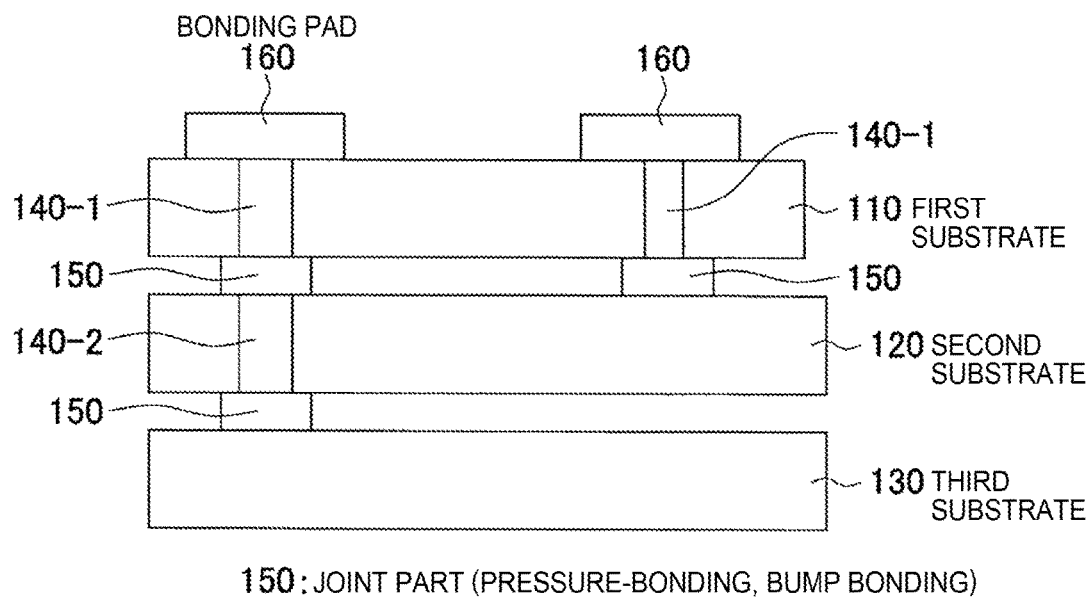
150: JOINT PART (PRESSURE-BONDING, BUMP BONDING)
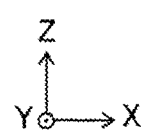

EXAMPLE OF CHARGE TRANSFER WHERE
PARASITIC CAPACITANCE IN TSV (n+) REGION IS SMALL

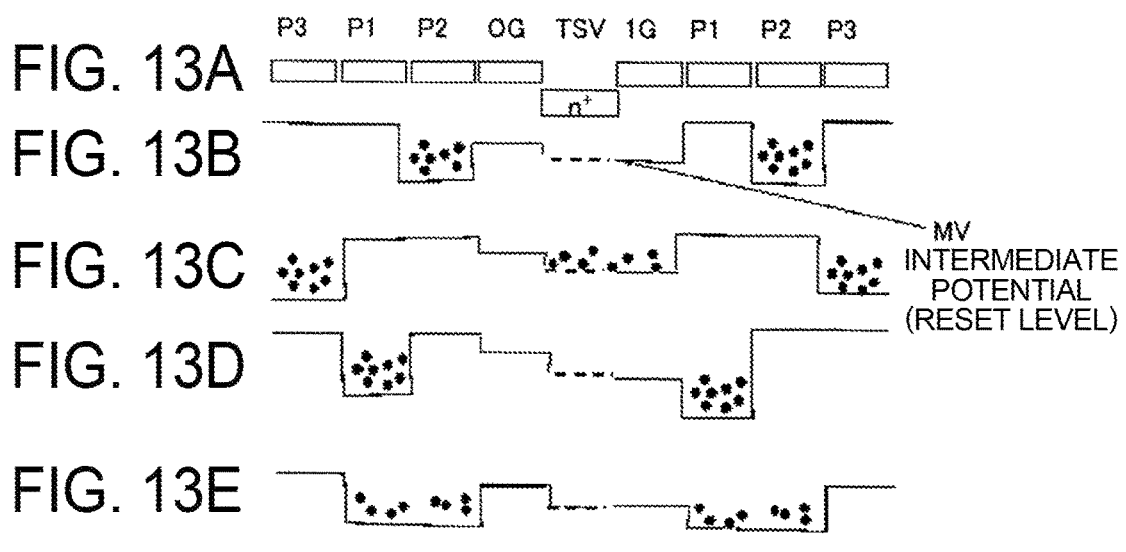
EXAMPLE OF CHARGE TRANSFER WHERE
PARASITIC CAPACITANCE IN TSV (n+) REGION IS LARGE

STRUCTURAL VIEW OF BACK SURFACE IRRADIATION TYPE CMOS IMAGE SENSOR

STRUCTURAL VIEW OF STACKED TYPE CMOS IMAGE SENSOR

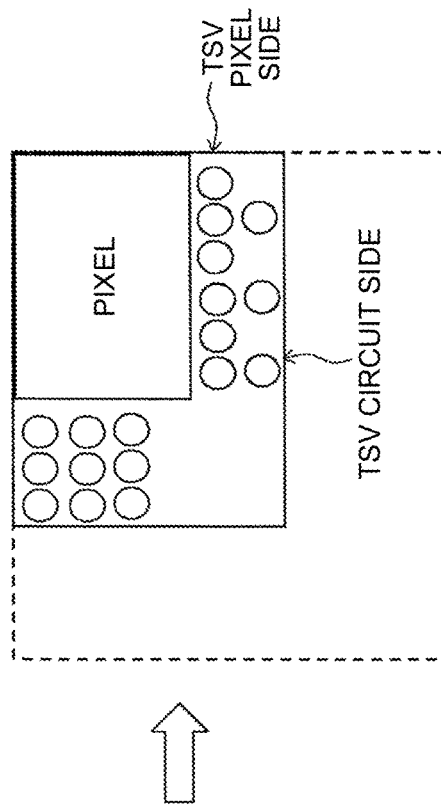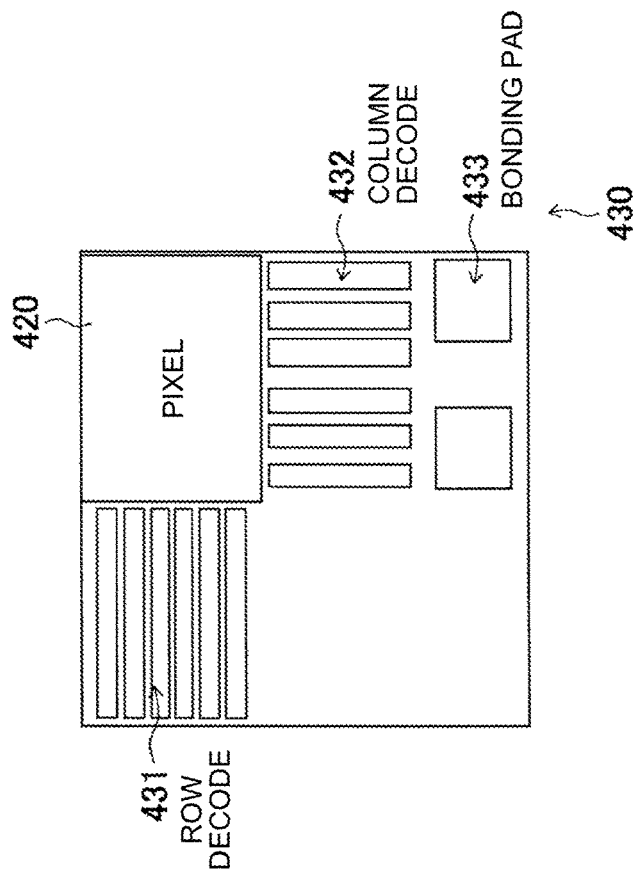

FIG. 25A
FIG. 25B
FIG. 25C
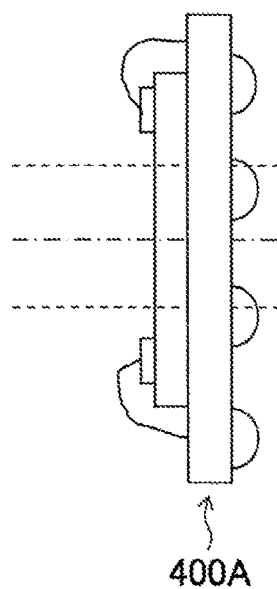
400A
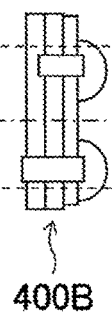
400B
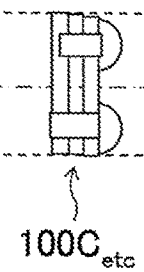
100C$_{etc}$

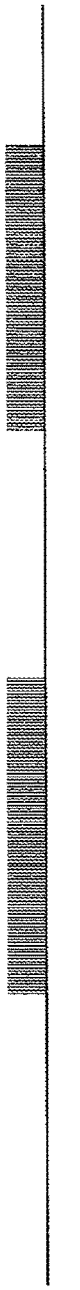
FIG. 28A  CHARGE READING φR
FIG. 28B  VERTICAL TRANSFER (TO STORAGE PART) φV2
FIG. 28C  VERTICAL TRANSFER (TO H TRANSFER PART) φV1
FIG. 28D  HORIZONTAL TRANSFER φH
FIG. 28E  BUFFER OUTPUT VOUT

SOLID-STATE IMAGING DEVICE, METHOD FOR PRODUCING SOLID-STATE IMAGING DEVICE, AND ELECTRONIC APPARATUS

TECHNICAL FIELD

The present invention relates to a solid-state imaging device using a photoelectric conversion element which detects light and generates a charge, a method for producing a solid-state imaging device, and an electronic apparatus.

BACKGROUND ART

As a solid-state imaging device (image sensor) using a photoelectric conversion element which detects light and generates a charge, a CCD (charge coupled device) image sensor and CMOS (complementary metal oxide semiconductor) image sensor have been put to practical use. CCD image sensors and CMOS image sensors are widely applied as portions of digital cameras, video cameras, monitoring cameras, medical endoscopes, personal computers (PC), mobile phones and other portable terminal devices (mobile devices), and other various types of electronic apparatuses.

A CCD image sensor and CMOS image sensor use photodiodes for the photoelectric conversion elements, but differ in methods of transferring photoelectrically converted signal charges. A CCD image sensor transfers signal charges to an output part by a vertical transfer part (vertical CCD, VCCD) and horizontal transfer part (horizontal CCD, HCCD) then converts them to electrical signals which it then amplifies. Contrary to this, a CMOS image sensor amplifies charges converted for each pixel including a photodiode and outputs them as readout signals.

Below, the basic configurations of a CCD image sensor and CMOS image sensor will be explained.

FIG. 1 is a view showing the basic configuration of an interline transfer (IT) type CCD image sensor.

An IT (interline transfer) type CCD image sensor 1 basically includes a photosensitive part 2, horizontal transfer part (horizontal CCD) 3, and output part 4. The photosensitive part 2 has a plurality of pixel portions 21 which are arranged in a matrix and convert incident light to signal charges having charge amounts in accordance with the light quantity thereof and vertical transfer parts (vertical CCD) 22 as shielded charge transfer parts which vertically transfer the signal charges of the plurality of pixel portions 21 in unit of columns. The horizontal CCD 3 horizontally transfers one line's worth of the signal charges which are shifted from the plurality of vertical CCDs 22 in order in a horizontal scanning period. The output part 4 includes a charge detection-use floating diffusion layer, that is, a "floating diffusion (FD)", for converting the transferred signal charges to signal voltages and outputs the signals obtained in the FD to a not shown signal processing system.

In this IT type CCD image sensor 1, the vertical CCD functions as an analog memory, repeats a line shift and a horizontal transfer by the horizontal CCD 3, and outputs the signals (frame signals) of all pixels in order from the output part 4.

This IT type CCD image sensor 1 has a structure enabling progressive reading (progressive scanning), but transfers the signal charges by the horizontal CCD 3, so high speed transfer is difficult.

FIG. 2 is a view showing the basic configuration of a frame interline transfer (FIT) type CCD image sensor.

The FIT (frame interline transfer) type CCD image sensor 1A is configured with shielded charge storage parts (storage parts) 5 arranged between the output stages of the vertical CCD 22 of the photosensitive part 2 in the IT type CCD image sensor 1 and the horizontal CCD 3. In the FIT type CCD image sensor 1A, all signal charges are transferred at the same time from the vertical CCD 22 of the photosensitive part 2 which received the signal charges (bundle) from the pixel portions 21 to the completely shielded storage parts 5 by high speed frame transfer.

In this way, in the FIT type CCD image sensor 1A, the signal charges read out from the pixel portions 21 in the photosensitive part 2 are transferred at the same time to the storage parts 5 by the vertical CCD 22. Therefore, compared with the IT type CCD image sensor 1 in FIG. 1, higher speed transfer is possible. However, an FIT type CCD image sensor 1A forms storage parts 5, therefore the chip area becomes about two times larger than an IT type CCD image sensor.

Note that, the CCD image sensor explained above features the possibility of global shutter reading simultaneously starting storage of photocharges for all pixels.

FIG. 3 is a view showing the basic configuration of a CMOS image sensor.

A CMOS image sensor 1B basically includes a photosensitive part comprised of a pixel array part 6, a row decoder (or row scanning circuit) 7, a column decoder (or horizontal scanning circuit) 8, an output part (output amplifier) 9, and column switches CSW. Further, in FIG. 3, LSL indicates row scanning lines, LSG indicates signal reading lines, and LTR indicates a transfer line.

In the CMOS image sensor 1B, the pixel array part is configured arranging a plurality of pixels including photodiodes in a matrix. In the CMOS image sensor 1B, the pixels PXL in the pixel array part 6 are controlled by each row by row control signals (pulse signals) supplied from the row decoder 7. A signal which is output from a pixel PXL to the output signal line LSG is transmitted through a column switch CSW to the transfer line LTR by the column scan by the column decoder 8 and is output to the outside by the output part 9.

This CMOS image sensor 1B is structured so that high speed transfer of signals is possible, but global shutter reading cannot be carried out.

In this way, the CMOS image sensor basically is structured so that global shutter reading cannot be carried out, but a CMOS image sensor that employs a multilayer structure and enables global shutter reading has been proposed (see for example NPLT 1).

FIG. 4 is a view showing an example of the configuration of a CMOS image sensor employing a stacked architecture.

A CMOS image sensor 1C in FIG. 4 employs a stacked architecture in which a first substrate 11 and a second substrate 12 sandwich a shield layer 13. On the first substrate 11, a photodiode (photoelectric conversion element) array part 6-1 and a part 7-1 of the row scanning circuit 7 are formed. Further, on the second substrate 12, a storage node array 6-2, the remaining part 7-2 of the row scanning circuit 7, column buffers CBUF, a horizontal scan circuit (column decoder) 8, output part 9, etc. are formed.

The characteristic feature of this CMOS image sensor 1C resides in elimination of the defect of general CMOS image sensors, i.e., the defect of the inability of global shutter reading.

CITATION LIST

Non-Patent Literature

NPLT 1: ISSCC 2013/SESSION 27/IMAGE SENSORS/ 27.3 "A Rolling-Shutter Distortion-Free 3D Stacked Image Sensor with-160 dB Parasitic Light Sensitivity In-Pixel Storage Node"

SUMMARY OF INVENTION

Technical Problem

The basic configurations of a CCD image sensor and CMOS image sensor were explained above. The CCD image sensor explained above has the characteristic feature of enabling global shutter reading for simultaneously starting storage of photocharges for all pixels.

However, although an IT type CCD image sensor 1 can perform progressive reading, it has the disadvantage it transfers signal charges by the horizontal CCD 3, so high speed transfer is difficult.

An FIT type CCD image sensor 1A can perform higher speed transfer compared with an IT type CCD image sensor 1. However, it forms storage parts 5, therefore the chip area becomes about 2 times larger than that of an IT type CCD image sensor.

Contrary to this, the CCD image sensor 1B in FIG. 3 can perform high speed transfer of signals, but has the disadvantage that global shutter reading is not possible.

The CMOS image sensor 1C in FIG. 4 has the characteristic feature of the elimination of the defect that the global shutter reading is impossible, but has the following disadvantage. The CMOS image sensor 1C, as disclosed in NPLT 1, has a configuration of selecting 4 pixels for reading. Therefore, global shutter reading in the exact meaning is not realized. In this way, in the CMOS image sensor 1C, strictly speaking, global shutter reading cannot be realized and simultaneous reading cannot be carried out, therefore it is difficult to completely eliminate motion blur at the time of shooting a moving body. Further, in the CMOS image sensor 1C, a parasitic capacitance increases due to pixel coupling, and a drop of detection gain is caused. Due to these matters, in the CMOS image sensor 1C, there is a tradeoff between global shutter reading and read gain, therefore many pixels become connected and readout is difficult. In other words, the CMOS image sensor 1C is restricted in addition of pixels. In the CMOS image sensor 1C, it is necessary to form bump structures in the pixel array in order to form a multilayer structure, therefore restriction of layout and dark current, white flaws, and other deterioration of pixel characteristics are liable to be caused. Further, the CMOS image sensor 1C has the defect that the kTC noise increases.

The present invention provides a solid-state imaging device in which high speed reading becomes possible with a small chip area, there is little restriction in layout, and white flaws and other deterioration of pixel characteristics can be suppressed, a method for producing the solid-state imaging device, and an electronic apparatus.

Solution to Problem

A solid-state imaging device of a first aspect of the present invention has a photosensitive part including a plurality of photoelectric conversion elements which are arranged in a matrix and a plurality of charge transfer parts which transfer signal charges of the plurality of photoelectric conversion elements in unit of columns or rows, a plurality of charge storage parts for storing signal charges which are transferred by the plurality of charge transfer parts in the photosensitive part, a relay part which relays transfer of the signal charges transferred by the plurality of charge transfer parts in the photosensitive part to the charge storage parts, an output part for outputting the signal charges stored in the plurality of charge storage parts as electrical signals, a first substrate on which the photosensitive part is formed, and a second substrate on which the charge storage parts and the output part are formed, wherein at least the first substrate and the second substrate are stacked, and the relay part electrically connects the charge transfer parts formed on the first substrate and the charge storage parts formed on the second substrate by connecting parts passing through the substrates outside of the photosensitive region in the photosensitive part.

A method for producing a solid-state imaging device of a second aspect of the present invention has a step of forming, on the first substrate, a photosensitive part including a plurality of photoelectric conversion elements which are arranged in a matrix and a plurality of charge transfer parts which transfer signal charges of the plurality of photoelectric conversion elements in unit of columns or rows, a step of forming, on the second substrate, at least a plurality of charge storage parts for storing signal charges transferred by the plurality of charge transfer parts in the photosensitive part and an output part which outputs the signal charges stored in the plurality of charge storage parts as electrical signals, and a step of, in a state where the first substrate and the second substrate are stacked, electrically connecting the charge transfer parts formed on the first substrate and the charge storage parts formed on the second substrate by connecting parts passing through the substrates outside of the photosensitive region in the photosensitive part.

An electronic apparatus of a third aspect of the present invention has a solid-state imaging device, an optical system of forming an image in a photosensitive part in the solid-state imaging device, and a signal processing part for processing output signals of the solid-state imaging device, wherein the solid-state imaging device has a photosensitive part including a plurality of photoelectric conversion elements which are arranged in a matrix and a plurality of charge transfer parts which transfer signal charges of the plurality of photoelectric conversion elements in unit of columns or rows, a plurality of charge storage parts for storing signal charges which are transferred by the plurality of charge transfer parts in the photosensitive part, a relay part which relays transfer of the signal charges transferred by the plurality of charge transfer parts in the photosensitive part to the charge storage parts, an output part for outputting the signal charges stored in the plurality of charge storage parts as electrical signals, a first substrate on which the photosensitive part is formed, and a second substrate on which the charge storage parts and the output part are formed, wherein at least the first substrate and the second substrate are stacked, and the relay part electrically connects the charge transfer parts formed on the first substrate and the charge storage parts formed on the second substrate by connecting parts passing through the substrates outside of the photosensitive region in the photosensitive part.

Advantageous Effect of Invention

According to the present invention, high speed reading becomes possible using a small chip area. In addition, there is little restriction in layout, and it becomes possible to suppress white flaws and another deterioration of pixel characteristics. Further, according to the present invention, it becomes possible to form a pixel portion by a CCD process having a good dark current characteristic. Further, miniaturization of pixels for global shutter becomes possible. Further, according to the present invention, a drive interface can be simplified. Further, it is also possible to eliminate the horizontal CCD, therefore reduction of the consumed power becomes possible. Further, according to the present invention, increase of functions such as digital output conversion and on-chip signal processing becomes possible.

BRIEF DESCRIPTION OF DRAWINGS

FIG. 7 is a view schematically showing a second example of a stacked substrate structure of the solid-state imaging device according to the present embodiment.

FIG. 13A to FIG. 13E are views for explaining a transfer operation of signal charges by the relay part in the present embodiment and a view showing an example of the charge transfer in a case where the parasitic capacitance of a through-via (TSV) region is large.

FIG. 24 A to FIG. 24B are views for explaining an example of chip reduction according to the stacked structure of the CMOS image sensor.

FIG. 25 A to FIG. 25C are views showing simplified cross-sections of a CMOS image sensor chip which does not have a stacked structure, a CMOS image sensor chip having a stacked structure, and a CCD image sensor chip according to the present embodiment.

FIG. 28 A to FIG. 28E are views showing an example of the timing of a drive signal of stacked type CCD image sensor comprising a solid-state imaging device according to the sixth embodiment.

DESCRIPTION OF EMBODIMENTS

Below, embodiments of the present invention will be explained with reference to the drawings.

First Embodiment

Figure 1:
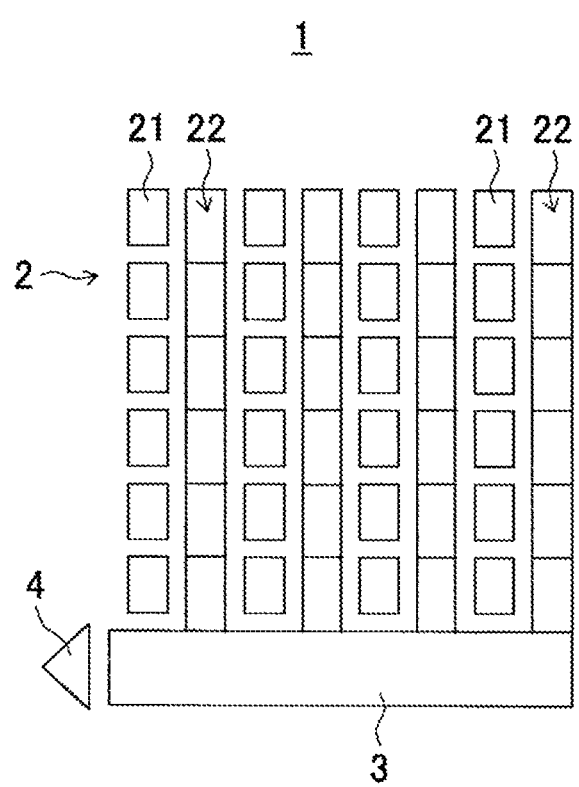
FIG. 1 is a view showing a basic configuration of an IT type CCD image sensor.
Figure 2:
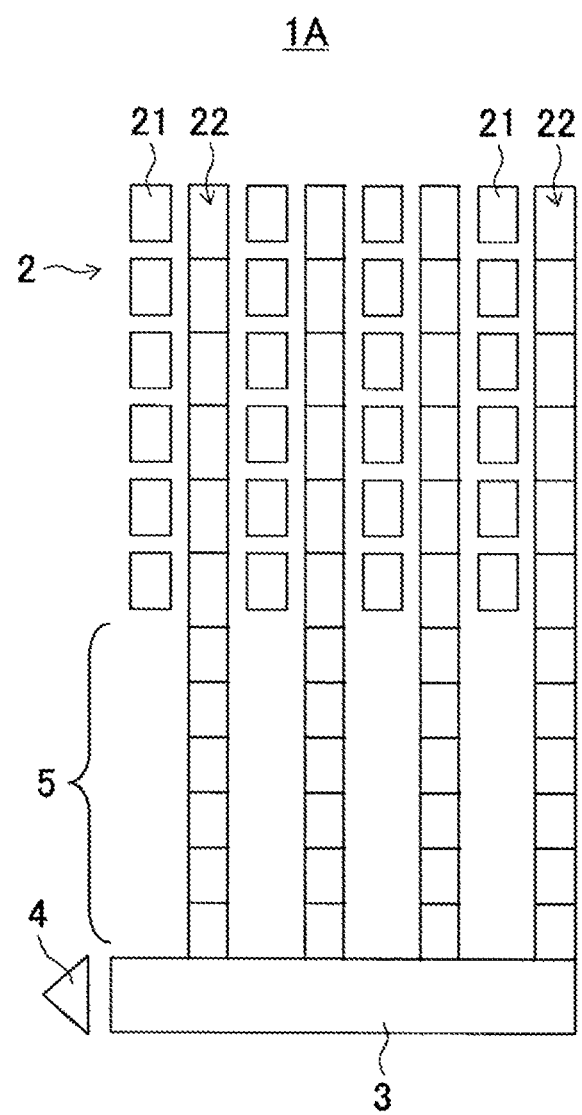
FIG. 2 is a view showing a basic configuration of an FIT type CCD image sensor.
Figure 3:
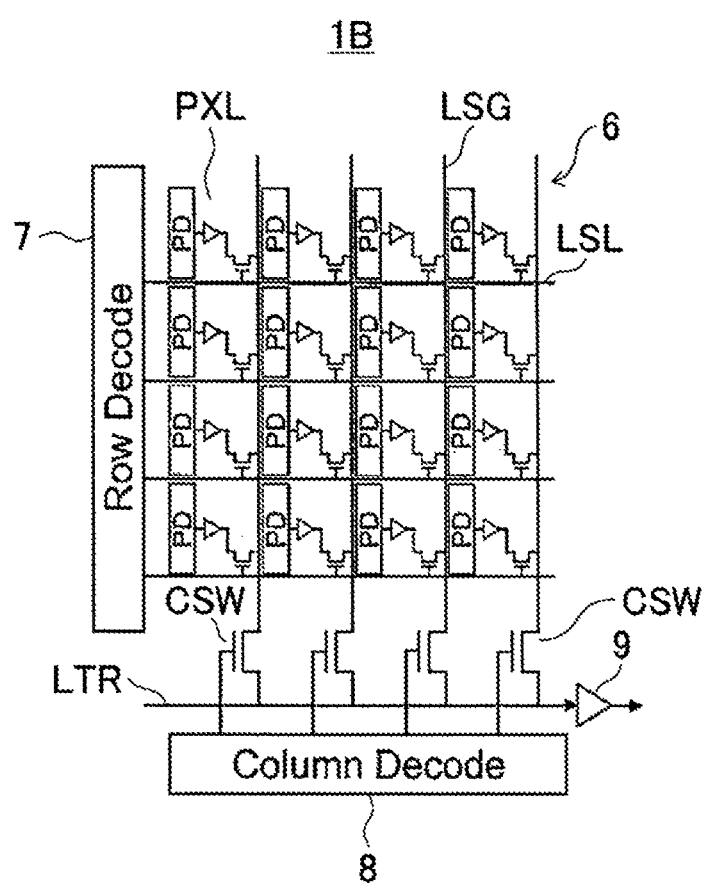
FIG. 3 is a view showing a basic configuration of a CMOS image sensor.
Figure 4:
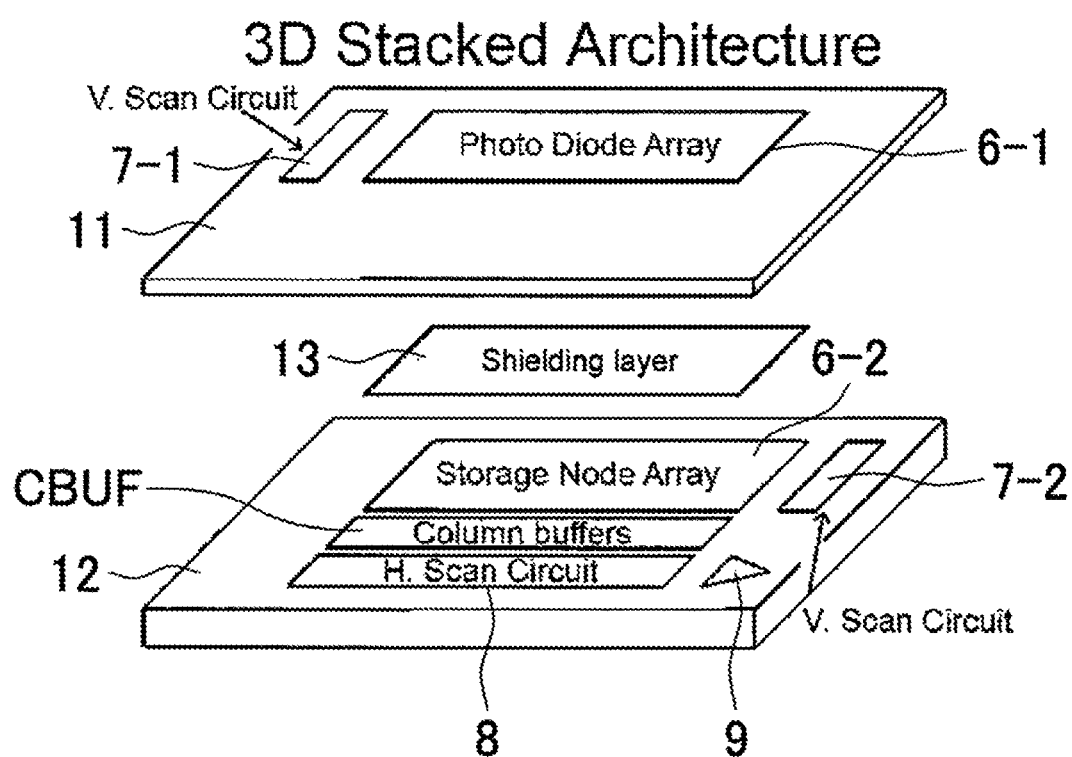
FIG. 4 is a view showing an example of the configuration of a CMOS image sensor employing a stacked architecture.
Figure 5:
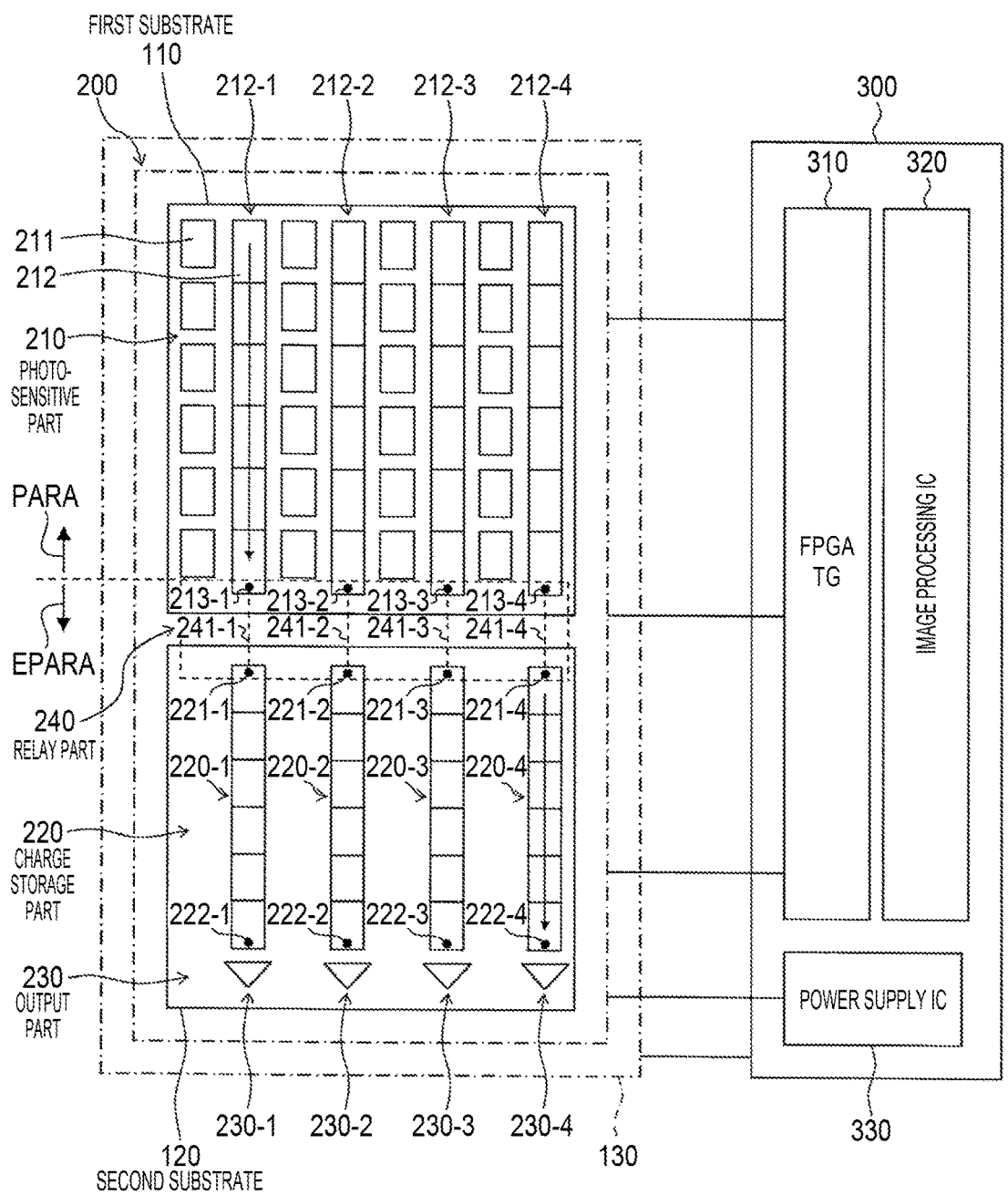
FIG. 5 is a view showing an example of the configuration of a solid-state imaging device according to a first embodiment of the present invention spread out flat.
Figure 6:
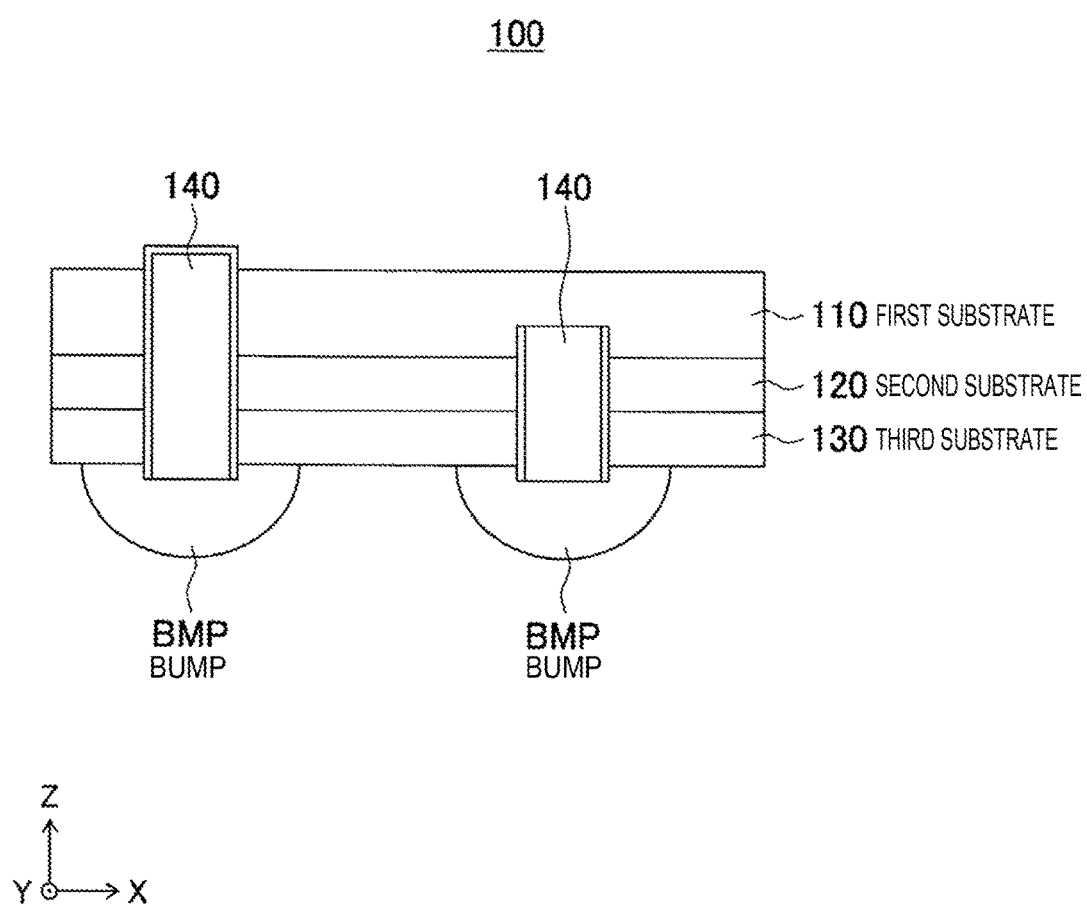
FIG. 6 is a view schematically showing a first example of a stacked substrate structure of the solid-state imaging device according to the present embodiment.
Figure 8:
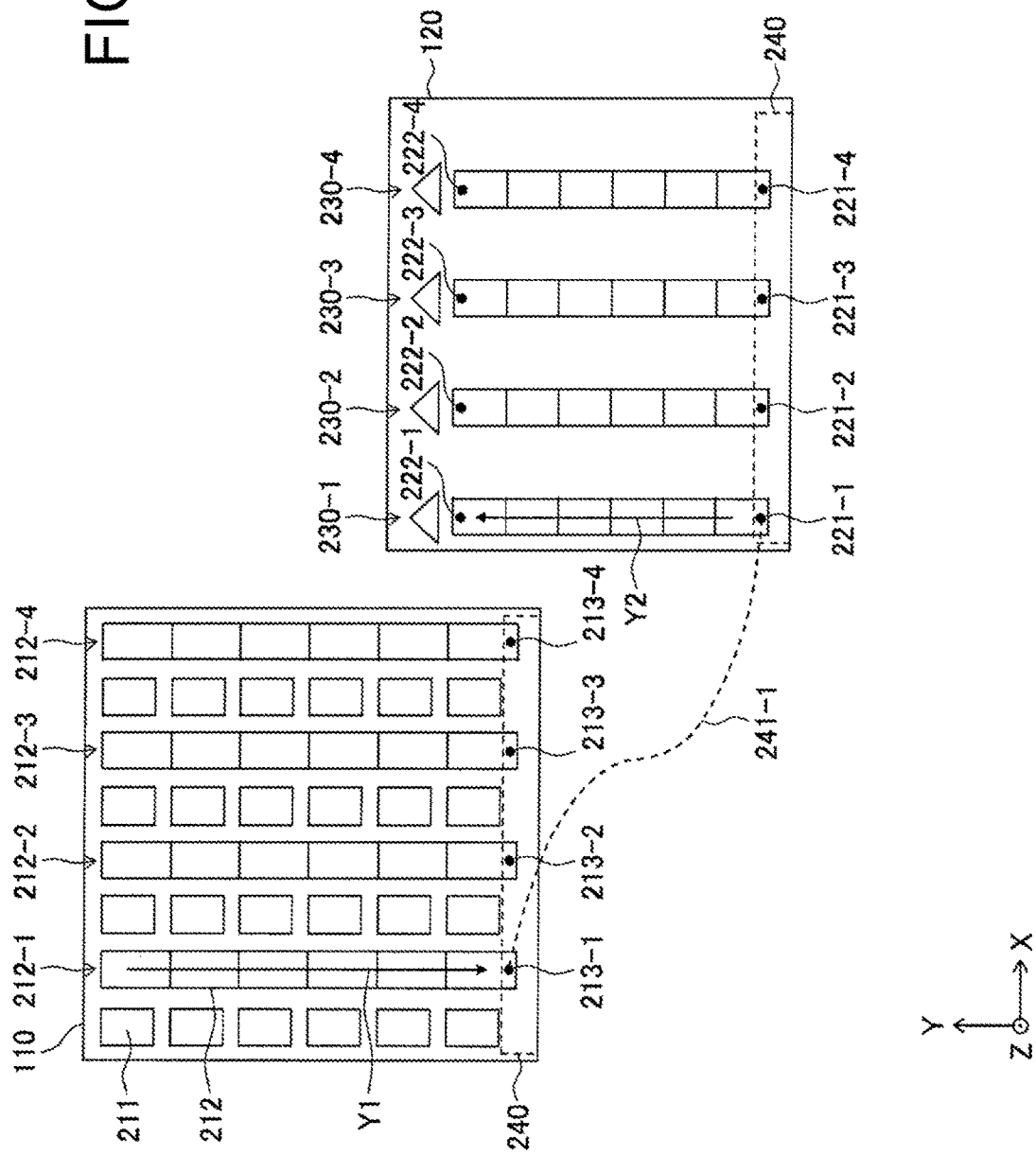
FIG. 8 is a view for explaining the actual relationship of arrangement of a photosensitive part on a first substrate and charge storage parts on a second substrate which are stacked in the solid-state imaging device according to the first embodiment.

FIG. 5 is a view showing an example of the configuration of a solid-state imaging device according to a first embodiment of the present invention spread out flat. FIG. 6 is a view schematically showing a first example of a stacked substrate structure of the solid-state imaging device according to the present embodiment. FIG. 7 is a view schematically showing a second example of the stacked substrate structure of the solid-state imaging device according to the present embodiment. FIG. 8 is a view for explaining the relationship of arrangement between the photosensitive part on the first substrate and a peripheral circuit part on the second substrate which are stacked in the solid-state imaging device according to the first embodiment.

To the present solid-state imaging device 100, an image sensor similar to for example an FIT (frame interline transfer) type CCD image sensor or FT (frame transfer) type CCD image sensor can be applied. In the following description, an explanation will be given taking as an example the FIT type.

The solid-state imaging device 100 is structured having a first substrate 110, second substrate 120, and third substrate 130 stacked together. In the solid-state imaging device 100, for example, as shown in FIG. 6 and FIG. 7, the second substrate 120 is stacked on the third substrate 130, and the first substrate 110 is stacked on the second substrate 120. Note that, the stacked substrates are for example adhered to each other as shown in FIG. 6 or joined by pressure bonding or microbumps as shown in FIG. 7. Further, electrical connection among the substrates is realized by through-vias (Through Silicon Via: TSV) 140 or joint parts 150 such as microbumps and pressure bonding.

In the example in FIG. 6, electrical connection among the substrates is realized through the through-vias 140 which penetrate through the stacked first substrate 110, second substrate 120, and third substrate 130. Bumps BMP are joined to the exposed portions of the through-vias 140 on the third substrate 130 side.

In the example in FIG. 7, a through-via 140-1 is formed in the first substrate 110, and a through-via 140-2 is formed in the second substrate 120. The through-via 140-1 in the first substrate 110 and the through-via 140-2 in the second substrate 120 are joined by joint parts 150 formed by pressure bonding or microbumps. Further, bonding pads 160 are joined to the upper surface side exposed parts of the through-vias 140-1 in the first substrate 110.

Note that, in the present embodiment, on the first substrate 110 and second substrate 120, imaging element parts 200 provided with the functions for storing and transferring and for outputting the signal charges obtained by imaging are formed.

In the present embodiment, as the imaging element parts 200, a photosensitive part 210 having an imaging function is formed on the first substrate 110, while charge storage parts 220 having charge storage functions and output parts 230 are formed on the second substrate 120. Further, between the first substrate 110 and the second substrate 120, a relay part 240 which relays the transfer of the signal charges transferred by the plurality of charge transfer parts in the photosensitive part 210 to the charge storage parts 220 is formed over the two substrates.

The solid-state imaging device 100 has a signal processing and power supply part (hereinafter, referred to as a signal processing part) 300 which controls driving of the photosensitive part 210, charge storage parts 220, and the output parts 230 and so on and performs predetermined processing with respect to the electrical signals which are output from the output parts 230. The signal processing part 300 in FIG. 5 includes a timing generator 310 formed by an FPGA or the like, image processing circuit (image processing IC) 320, and power supply circuit (power supply IC) 330.

Note that, it is also possible to mount the signal processing part 300 including the timing generator 310, image processing circuit (image processing IC) 320, and power supply circuit (power supply IC) 330 after forming them on different substrates or on the second substrate 120 or third substrate 130 and stacking them. By configuring them in this way, it becomes also possible to incorporate a small-sized camera system in a single package.

The photosensitive part 210 formed on the first substrate 110 includes pixel portions 211, each including a photoelectric conversion element comprised of a photodiode (PD), arranged in a matrix (m rows and n columns) and a plurality of charge transfer parts comprised of vertical transfer parts (vertical CCD: VCCD) 212 (-1 to -4) which transfer the signal charges of the photoelectric conversion elements of the plurality of pixel portions 211 in unit of columns (or rows). In the photosensitive part 210, the vertical transfer parts 212 are shielded by not shown light shielding films and are driven for transfer by 2-phase, 4-phase, or other such transfer pulses by the signal processing part 300. The signal charges by the pixel portions 211 are transferred in the column direction.

Note that, in FIG. 5 and FIG. 8, for simplification of the drawings, examples are shown in which the pixel portions 211 and vertical transfer parts 212 are arranged in a matrix comprised of six rows and four columns (matrix where m=6 and n=4). In FIG. 5 and FIG. 8, four columns of the vertical transfer parts 212-1 to 212-4 are arranged. Further, the vertical transfer parts 212-1 to 212-4 transfer the signal charges in the Y-direction in the orthogonal coordinate systems shown in FIG. 5 and FIG. 8.

The charge storage parts 220 formed on the second substrate 120 store the signal charges which are transferred by the plurality of vertical transfer parts 212-1 to 212-n (n=4 in the present embodiment) in the photosensitive part 210 and are relayed by the relay part 240. In the charge storage parts 220, (four in the present example) columns of charge storage parts 220-1 to 220-4 are arranged corresponding to the vertical transfer parts 212-1 to 212-4 in n (four in the present example) columns formed on the first substrate 110. The charge storage parts 220-1 to 220-4 transfer the signal charges relayed by the relay part 240 to the Y-direction.

In this way, the relay part 240 relays the transfer of the signal charges transferred by the plurality of columns of the vertical transfer parts 212-1 to 212-4 in the photosensitive part 210 to the charge storage parts 220. FIG. 5 schematically shows an example in which the signal charges are transferred in one direction Y1 along the flow toward the Y-direction in the figure to the photosensitive part 210 on the first substrate 110 and the charge storage parts 220 and output parts 230 on the second substrate 120. Note, in actuality, as shown in FIG. 8, after the signal charges are transferred in the Y-direction Y1 toward the lower part in the figure by the vertical transfer parts 212-1 to 212-4 in the photosensitive part 210 on the first substrate 110 and then relayed by the relay part 240, they are transferred by the charge storage parts 220-1 to 220-4 on the second substrate 120 to the Y-direction Y2 going toward the upper part in the figure inverse to that on the first substrate 110.

On the second substrate 120, input end parts 221-1 to 221-4 are formed at the one end parts of the charge storage parts 220-1 to 220-4, while output end parts 222-1 to 222-4 which are connected to the output parts 230-1 to 230-4 are formed at the other end parts. The input end parts 221-1 to 221-4 of the charge storage parts 220-1 to 220-4 are electrically coupled by the relay part 240 with the output end parts 213-1 to 213-4 which are positioned on the outside of the photosensitive region of the vertical transfer parts 212-1 to 212-4 by the connecting parts (241-1 to 241-4).

On the second substrate 120, the output parts 230 output the signal charges stored in the plurality of charge storage parts 220-1 to 220-4 as electrical signals to the signal processing part 300. The output parts 230-1 to 230-4 are connected at their input parts to the output end parts 222-1 to 222-4 of the charge storage parts 220-1 to 220-4.

Figure 9:
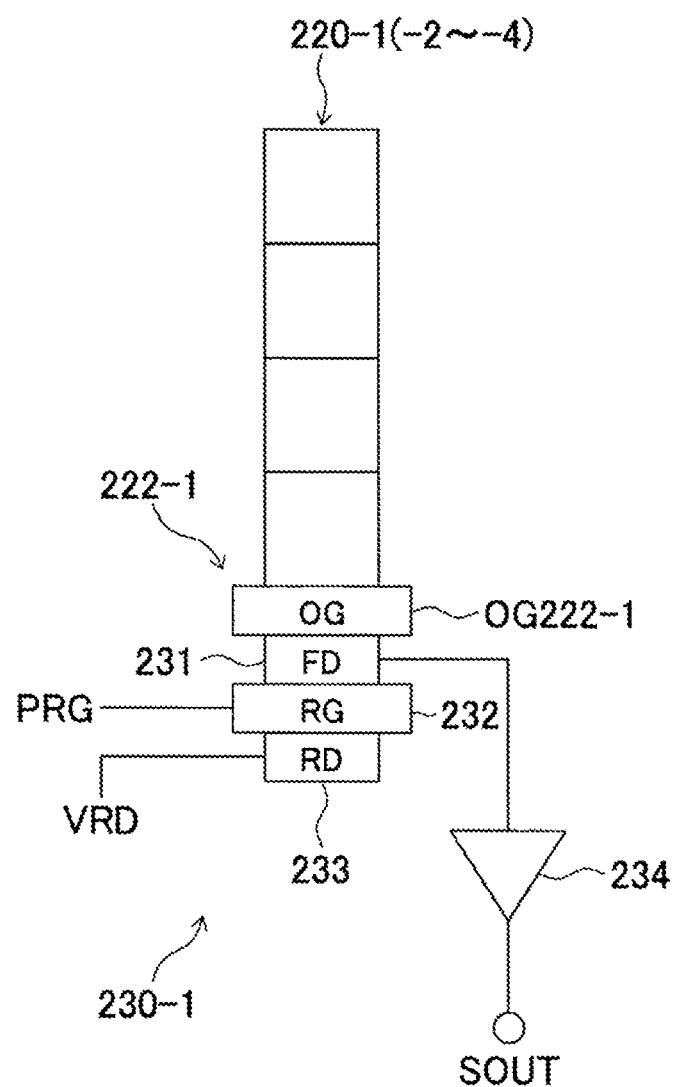
FIG. 9 is a view showing an example of the configuration of an output part according to the present embodiment.

FIG. 9 is a view showing an example of the configuration of an output part according to the present embodiment. FIG. 9 shows an example of the configuration of the output part 230-1 of one column. However, the output parts 230-2 to 230-4 of the other columns have similar configurations as that in FIG. 9.

The output part 230-1 is connected to the output gate OG222-1 in the output end part 222-1 of the charge storage part 220-1. The output part 230-1 in FIG. 9 includes a floating diffusion (FD: floating diffusion layer) 231, reset gate (RG) 232, reset drain 233, and output amplifier 234.

In the output part 230-1, a reset drain voltage VRD is applied to the reset drain 233, and a reset pulse PRG is applied to the reset gate 232 in a detection cycle of signal charge. Further, the signal charge stored in the floating diffusion 231 is converted to the signal voltage and is transmitted through the output amplifier 234 as an CCD output signal SOUT to the signal processing part 300.

The relay part 240 relays transfer of the signal charges which are transferred by the plurality of vertical transfer parts 212 in the photosensitive part 210 formed on the first substrate 110 to the charge storage parts 220-1 to 220-4 formed on the second substrate 120. The relay part 240 electrically connects the output end parts 213-1 to 213-4 of the vertical transfer parts 212-1 to 212-4 formed on the first substrate 110 and the input end parts 221-1 to 221-4 of the charge storage parts 220-1 to 220-4 formed on the second substrate 120 by the connecting parts passing through the substrates in a region EPARA out of a photosensitive region PARA in the photosensitive part 210. The relay part 240 connects the output end parts 213-1 to 213-4 of the vertical transfer parts 212-1 to 212-4 formed on the first substrate 110 and the input end parts 221-1 to 221-4 of the charge storage parts 220-1 to 220-4 formed on the second substrate 120 by the through-vias 241-1 to 241-4.

Concrete Example of Configuration of Stacked First Substrate and Second Substrate and Relay Part Here, an explanation will be given of a concrete example of the configuration of the first substrate 110, second substrate 120, and relay part shown above in outline.

Figure 10:
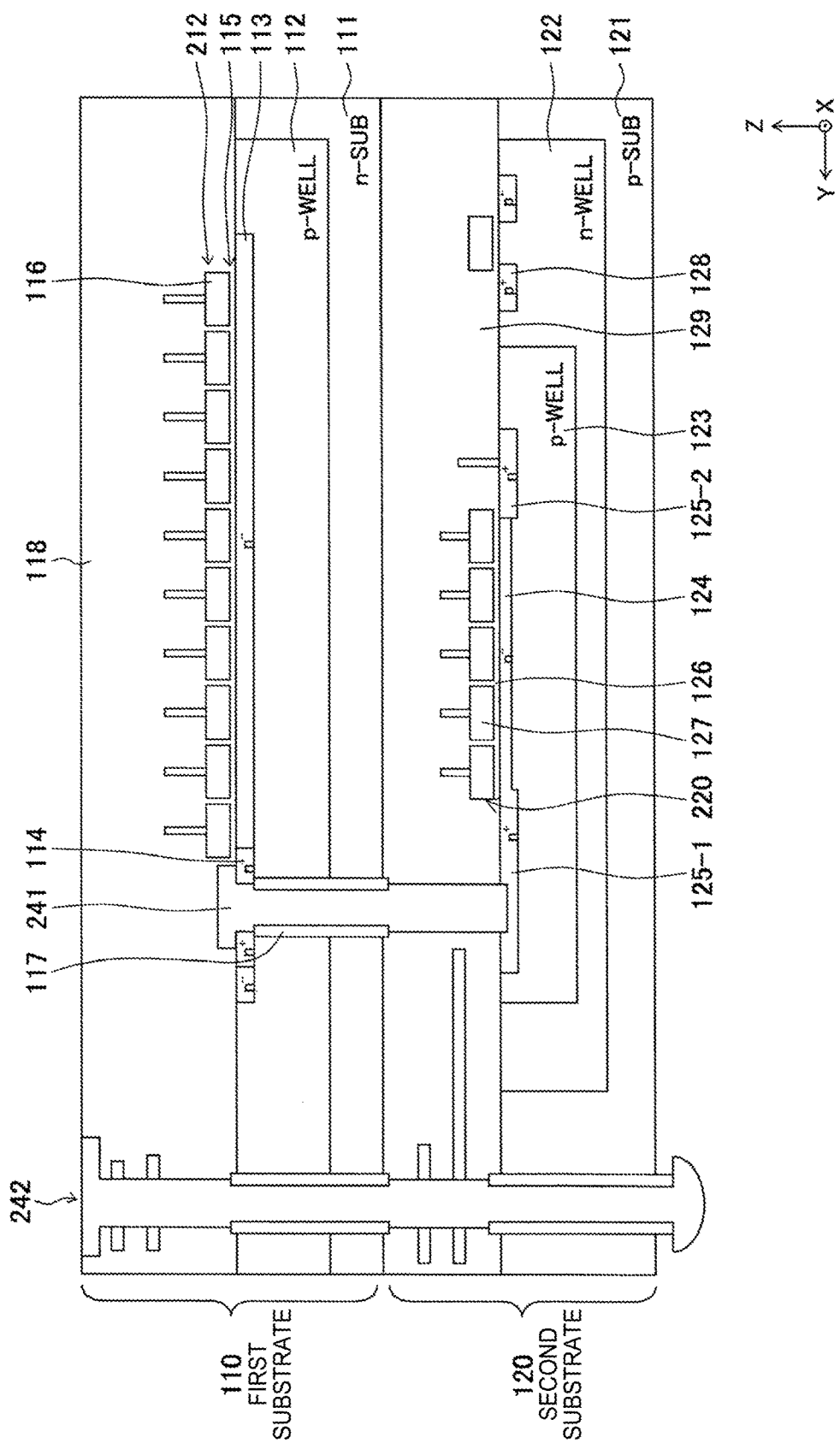
FIG. 10 is a simplified cross-sectional view for explaining a concrete example of the configuration of the stacked first substrate and second substrate and a relay part according to the present embodiment.

FIG. 10 is a simplified cross-sectional view for explaining a concrete example of the configuration of a stacked first substrate and second substrate and a relay part according to the present embodiment. FIG. 10 shows a portion corresponding to one column of a vertical transfer part 212 and a charge storage part 220 corresponding to the former.

In the present embodiment, the first substrate 110 is formed by a first conductivity type substrate, for example, an n-type substrate 111, and the second substrate 120 is formed by a second conductivity type substrate, for example, a p-type substrate 121. In the first substrate 110, a p-well 112 is formed in the n-type substrate (n-SUB) 111, and an n⁻ layer 113 is formed in the surface part of the p-well 112. In one end part of the Y-direction of the n⁻ layer 113, an n⁺ layer 114 for connection with the relay part comprised of the through-via 241 is formed. In the upper part of the n⁻ layer 113 and upper part of the n⁺ layer 114, transfer electrodes (transfer gates) 116 of the vertical transfer parts 212 are formed at predetermined intervals through a gate insulation film 115. A through-via (penetration electrode) 241 is formed (buried) in a through-hole which penetrates from the n⁺ layer 114 through the p-well 112 and n-type substrate 111 and reaches the n⁺ layer on the second substrate 120 side which will be explained later. Note that, on the wall portions of the p-well 112 and n-type substrate 111 in which the through-via 241 is formed, an insulation film 117 is formed. Further, above the p-well 112, n⁻ layer 113, n⁺ layer 114, gate insulation film 115, transfer electrodes 116, and through-via 241, an insulation film 118 is formed so as to cover them.

In the second substrate 120, an n-well 122 is formed in the p-type substrate (p-SUB) 121, a p-well 123 is formed in the n-well 122, and an n⁻ layer 124 is formed in the surface part of the p-well 123. In one end part of the Y-direction of the n⁻ layer 124, an n⁺ layer 125-1 for connection with the relay part comprised of the through-via 241 is formed. In the other end part of the Y-direction of the n⁻ layer 124, an n⁺ layer 125-2 which becomes the floating diffusion FD or the like is formed. In the upper part of the n⁻ layer 124 and upper part of the n⁺ layer 125, the transfer electrodes 127 of the charge storage parts 220 are formed at predetermined intervals through a gate insulation film 126. Further, in the surface part of the n-well 122, a p⁺ layer 128 etc. for forming the peripheral circuit are formed. Further, above the n-well 122, p-well 123, n⁻ layer 124, n⁺ layer 125, and gate insulation film 126 etc., an insulation film 129 is formed so as to cover them.

The first substrate 110 and the second substrate 120 having the above configurations are stacked so that the bottom surface of the n-type substrate 111 of the first substrate 110 and the surface (upper surface) of the insulation film 129 of the second substrate 120 are adhered to each other. In other words, the second substrate 120 is formed so as to be superimposed on the back surface of the first substrate 110. Note that, the vertical transfer parts 212 formed on the first substrate 110 and the charge storage parts 220 formed on the second substrate 120 are shielded by light shielding films made of metal layers or other light shielding materials.

Further, in the example in FIG. 10, through-vias 242 penetrating through the first substrate 110 and second substrate 120 are formed. On the wall portions of the p-well 112 and n-type substrate 111 on the first substrate 110 in which the through-vias 242 are formed and on the p-type substrate 121 of the second substrate 120, insulation films are formed.

In the present embodiment, as explained above, the first substrate 110 is formed by the n-type substrate 111. Therefore, in the first substrate 110 on which the pixel portion 211 is formed, a vertical overflow drain (VOD) structure is employed.

Figure 11:
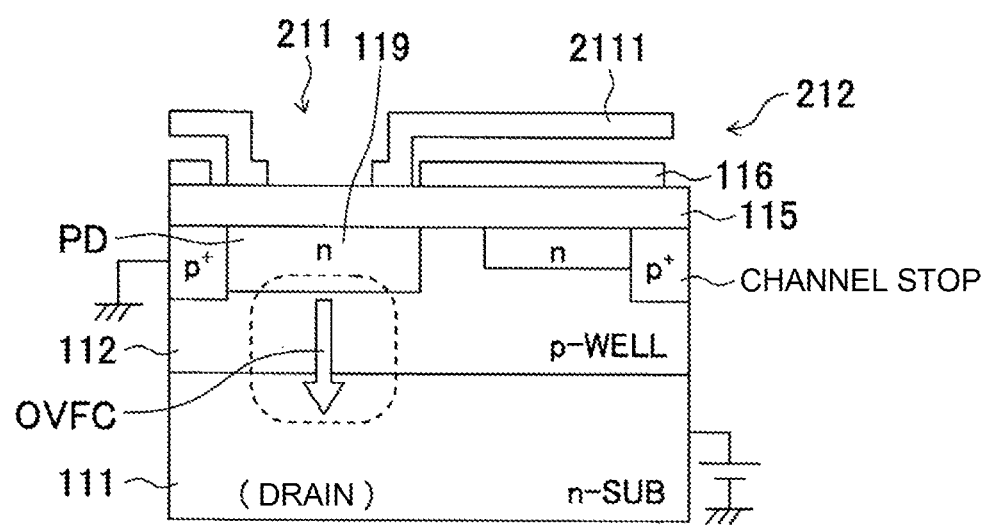
FIG. 11 is a view for explaining the configuration and principle of a vertical overflow drain which is employed in the pixel portion formed on the first substrate according to the present embodiment.
Figure 12A:
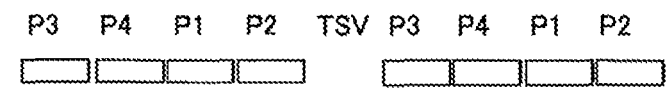
FIG. 12A to FIG. 12G are views for explaining a transfer operation of signal charges by the relay part in the present embodiment and a view showing an example of the charge transfer in a case where a parasitic capacitance of a through-via (TSV) region is small.
Figure 12B:
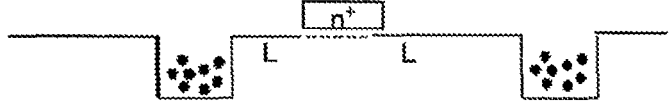
Figure 12C:
Figure 12D:
Figure 12E:
Figure 12F:
Figure 12G:

FIG. 11 is a view for explaining the configuration and principle of the vertical overflow drain employed in the pixel portion formed on the first substrate according to the present embodiment. In FIG. 11, notation 2111 indicates a light shielding film, and OVFC indicates an overflow channel.

The vertical overflow drain VOD is realized as in the following way. A PD (photoelectric conversion element) of the pixel portion 211 and the vertical transfer part (VCCD) 212 are formed in the p-well 112 and a positive voltage is applied to the n-type substrate 111 by bringing the p-well 112 to the reference potential, so an inverse bias state is retained. This inverse bias forms a potential barrier against the diffusion of electrons from the n-type substrate 111 and completely blocks entry of optically generated electrons and thermally generated electrons into the PD or vertical transfer part (VCCD) 212. Due to this, crosstalk of signals is improved to a level not posing a problem, and smear is rapidly reduced. Further, a dark current noise component caused by thermal diffusion current from the n-type substrate 111 is completely suppressed.

Next, a principle of discharge of excessive electrons in the vertical overflow drain VOD will be explained. A pn junction depletion layer between the p-well 112 and the n-type substrate 111 is enlarged by an inverse bias voltage. If an impurity layer of the p-well 112 directly under the PD is thin and low in concentration, a so-called punch-through state by which the junction depletion layer reaches the n-layer 119 of PD is easily realized. That is, the p-well 112 becomes completely depleted and rises in potential. At this time, if the n-layer is in an electron-filled state, electrons are strongly drawn onto the n-type substrate 111. Even when strong light strikes and excessive electrons are generated in the PD, the electrons are all swept from the n-layer 119 to the n-type substrate 111 over the raised potential of the p-well 112, therefore occurrence of blooming can be completely prevented.

Charge Transferring Operation by Relay Part

Next, a transfer operation of signal charges by the relay part 240 in the solid-state imaging device 100 having the above configuration will be considered.

In the present embodiment, as explained above, the relay part 240 connects the output end parts 213-1 to 213-4 of the vertical transfer parts 212-1 to 212-4 formed on the first substrate 110 and the input end parts 221-1 to 221-4 of the charge storage parts 220-1 to 220-4 formed on the second substrate 120 by the connecting parts comprised of the through-vias (TSV) 241-1 to 241-4.

Figure 14:
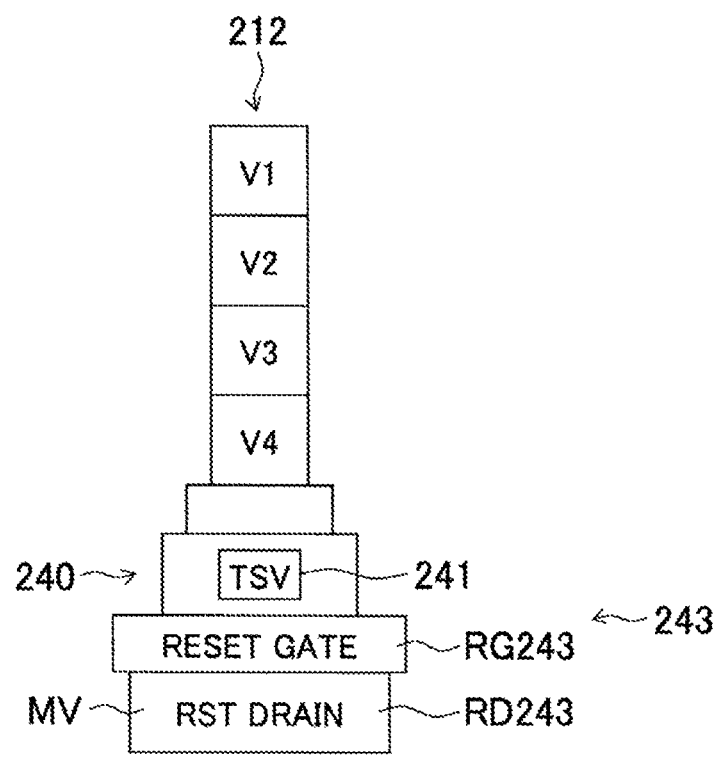
FIG. 14 is a view showing one example of the configuration of setting the TSV region to an intermediate potential.

FIG. 12A to FIG. 12G are views for explaining a transfer operation of the signal charges by the relay part in the present embodiment and a view showing an example of the charge transfer in a case where the parasitic capacitance in the through-via (TSV) region is small. FIG. 13A to FIG. 13E are views for explaining the transfer operation of the signal charges by the relay part in the present embodiment and a view showing an example of the charge transfer in a case where the parasitic capacitance in the through-via (TSV) region is large. FIG. 14 is a view showing an example of the configuration of setting the TSV region to an intermediate potential.

When there is a TSV region between the transfer electrodes (transfer gates), as in the configuration in FIG. 10, it is assumed to be an $n^+$ region. When the parasitic capacitance in the $n^+$ region is small, the signal charges are transferred in the following way. Where the modulation potential is $\Delta V$, the signal charge is $\Delta Q$, and the parasitic capacitance in the $n^+$ region is C, from the relationship of $\Delta V = \Delta QC$, the potential is modulated to almost the same phase as the potential of the adjoining transfer gate. Therefore, as shown in FIG. 12, charge transfer through the TSV region becomes possible.

When the parasitic capacitance in the TSV region ($n^+$ region) between the transfer electrodes (transfer gates) is large, the quantity of the signal charges which are necessary for modulation becomes large, therefore the potential is not modulated to the potential of the adjoining transfer gate. For this reason, as shown in FIG. 13 and FIG. 14, by setting the intermediate potential MV between the transfer gates through for example an intermediate potential setting-use reset transistor 243 which is connected to the $n^+$ region, charge transfer through the TSV region becomes possible. Specifically, as shown in FIG. 14, the through-via (TSV) region is set to the intermediate potential MV when transferring the signal charges by a reset transistor 234 having reset gate RG243 and reset drain RD243.

Figure 15:
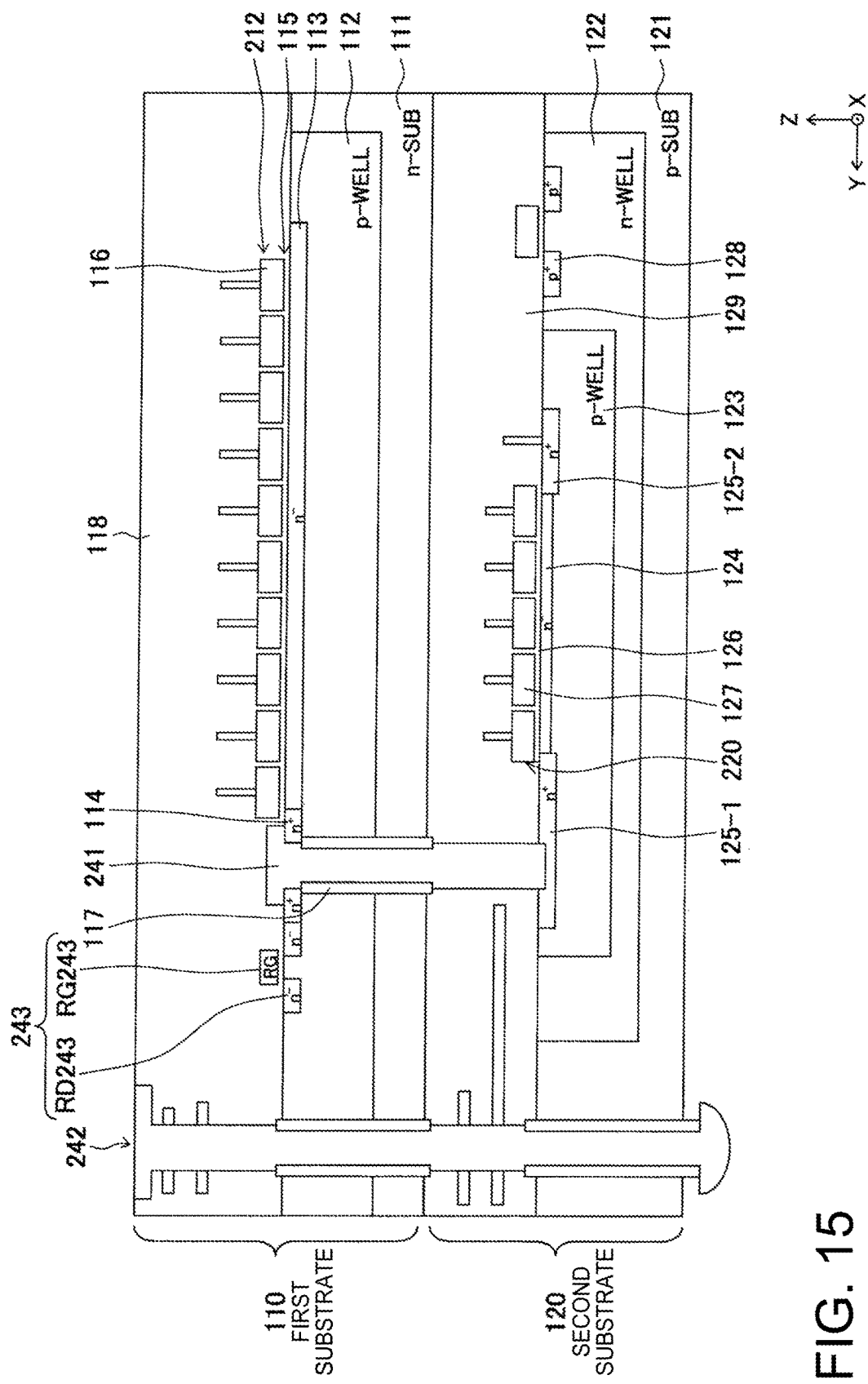
FIG. 15 is a simplified cross-sectional view showing an example of the configuration providing a reset transistor for setting the TSV region to an intermediate potential in the stacked first substrate and second substrate and the relay part according to the present embodiment.

FIG. 15 is a simplified cross-sectional view showing an example of a configuration providing a reset transistor for setting the TSV region to the intermediate potential in the stacked first substrate and second substrate and the relay part according to the present embodiment. It is also possible to form a reset transistor for setting the through-via (TSV) region to the intermediate potential as shown in FIG. 15 on one end part side of the $n^-$ layer 113 in addition to the configuration in FIG. 10.

Here, the "intermediate potential" means the potential between the potential which becomes the high level H and the potential which becomes the low level L.

As the example of transfer, as shown in FIG. 13, the output gate (OG) and input gate (IG) are provided on the two ends of the TSV node, a potential difference is given to the OG and IG for transferring, and the reset level of the TSV is made equal to the potential of the IG.

As described above, according to the first embodiment, on the first substrate 110, a photosensitive part 210 including the pixel portions 211, including photoelectric conversion elements comprised of the photodiodes (PD), arranged in a matrix and a plurality of charge transfer parts comprised of vertical transfer parts 212 which transfer the signal charges of the photoelectric conversion elements in the plurality of pixel portions 211 in unit of columns is formed. On the second substrate 120, charge storage parts 220 which store the signal charges transferred by the plurality of vertical transfer parts 212-1 to 212-n (n=4 in the present example) and relayed by the relay part 240 and output parts 230 which are provided for the individual vertical transfer columns are formed. Further, by the relay part 240, the output end parts 213-1 to 213-4 of the vertical transfer parts 212-1 to 212-4 formed on the first substrate 110 and the input end parts 221-1 to 221-4 of the charge storage parts 220-1 to 220-4 formed on the second substrate 120 are electrically coupled by the connecting parts passed through the substrates, for example through-vias 241 in the region EPARA outside of the photosensitive region PARA of the photosensitive part 210.

Accordingly, according to the first embodiment, the following effects can be obtained. According to the first embodiment, a progressive reading from the pixel portions 211 to the vertical transfer parts (vertical CCD) 212 is possible, and the signal charges transferred to the vertical transfer parts (vertical CCD) 212 are transferred through the connecting parts of the relay part 240 to the charge storage parts (storage parts) 220 in the second layer. The charge storage parts (storage parts) 220 are formed on the second layer comprised of the second substrate 120, therefore high speed reading with a small chip area becomes possible. Further, the connecting parts of the stacked substrates are formed outside of the pixel array, therefore formation of the image sensor with little restriction in layout and free from white flaws and other deterioration of pixel characteristics becomes possible. In other words, according to the first embodiment, it becomes possible to realize an image sensor capable of high speed driving with global reading without forming a special structure in the pixel array, that is, without causing deterioration of the SN ratio. Further, since the connecting parts comprised of the relay part 240 are formed on outside of the pixel array, formation of pixels without causing a drop of the sensitivity and increase of dark current becomes possible.

Second Embodiment

Figure 16:
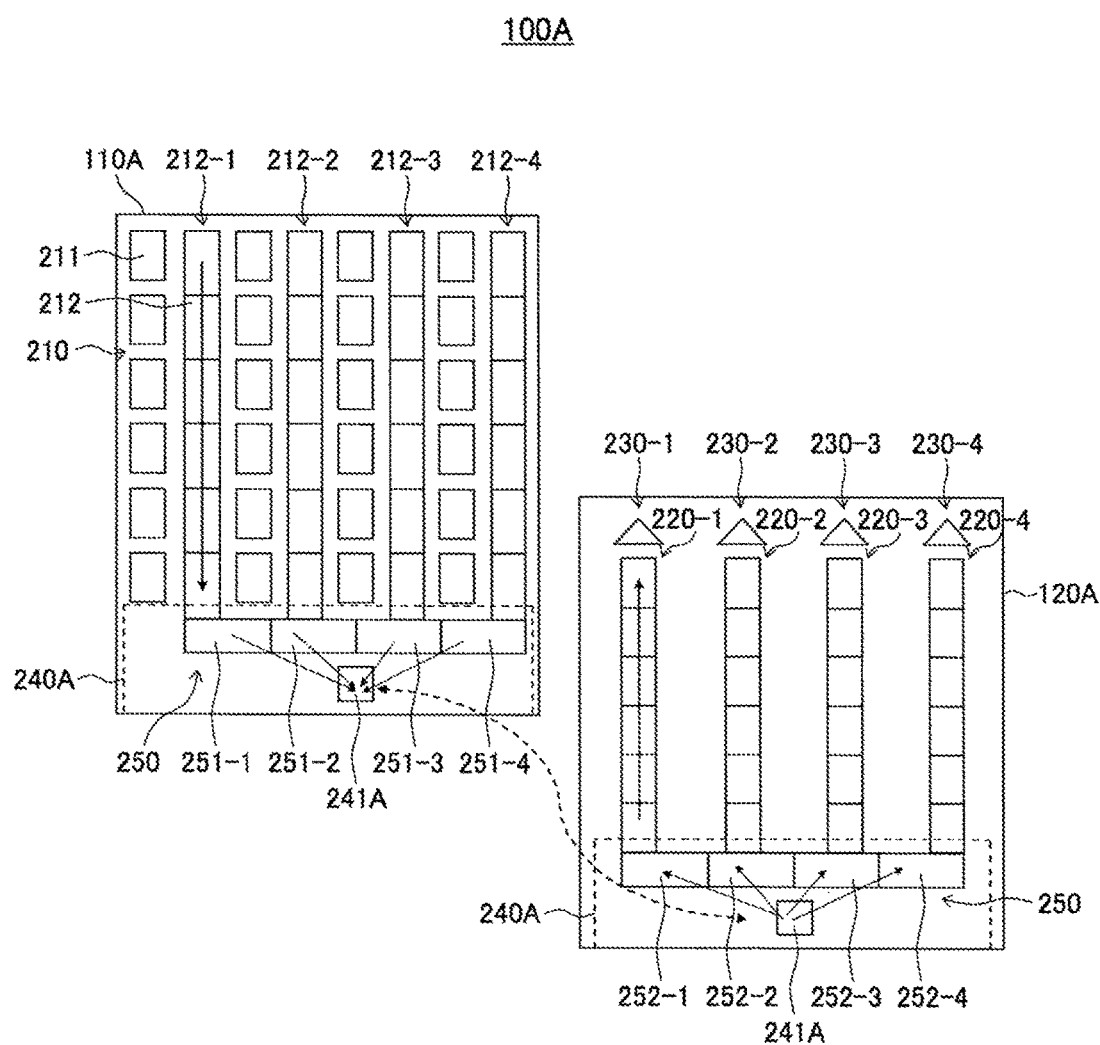
FIG. 16 is a view for explaining an example of the configuration of a solid-state imaging device according to a second embodiment of the present invention.

FIG. 16 is a view for explaining an example of the configuration of a solid-state imaging device according to a second embodiment of the present invention.

The difference of a solid-state imaging device 100A according to the second embodiment from the solid-state imaging device 100 in the first embodiment explained above is as follows. The solid-state imaging device 100A in the second embodiment includes a relay selecting part 250 which selectively connects a plurality of vertical transfer parts 212-1 to 212-4 and the plurality of charge storage parts 220-1 to 220-4.

In the second embodiment, a plurality of selection electrodes 251-1, 251-2, 251-3, and 251-4 are arranged in the relay part 240A on the first substrate 110A, and a plurality of selection electrodes 252-1, 252-2, 252-3, and 252-4 are arranged in the relay part 240A on the second substrate 120A. Further, on the first substrate 110A and second substrate 120A, one common through-via (TSV) 241A is formed for a plurality of selection electrodes 251-1 to 251-4, 252-1 to 252-4.

In FIG. 16, at the through-via 241A on the first substrate 110A side, the signal charges which are transferred through the vertical transfer parts 212-1 to 212-4 and are selected by either of the selection electrodes 251-1 to 251-4 are supplied. On the second substrate 120A side, the signal charges transferred through the through-via 241A are selected by either of the selection electrodes 252-1 to 252-4 and are transferred to the charge storage parts (storage parts) 220-1 to 220-4.

The basic operations in the configuration of FIG. 16 are carried out in the following way. The signal charges of the vertical transfer part 212-1 selected by the selection electrode 251-1 on the first substrate 110A side are transferred to the second substrate 120A side through the through-via 241A, selected by the selection electrode 252-1, and transferred to the charge storage part 220-1. The signal charges of the vertical transfer part 212-2 selected by the selection electrode 251-2 on the first substrate 110A side are transferred to the second substrate 120A side through the through-via 241A, selected by the selection electrode 252-2, and transferred to the charge storage part 220-2. The signal charges of the vertical transfer part 212-3 selected by the selection electrode 251-3 on the first substrate 110A side are transferred to the second substrate 120A side through the through-via 241A, selected by the selection electrode 252-3, and transferred to the charge storage part 220-3. The signal charges of the vertical transfer part 212-4 selected by the selection electrode 251-4 on the first substrate 110A side are transferred to the second substrate 120A side through the through-via 241A, selected by the selection electrode 252-4, and transferred to the charge storage part 220-4.

The above description covers the basic operations. It is also possible to configure the device so that the selection electrodes 251-1 to 251-4 and selection electrodes 252-1 to 254-4 are selected one by one. However, two or more selection electrodes may be simultaneously selected, or a predetermined selection electrode may not be selected in a predetermined operation, and so on. Various embodiments are possible. By performing such driving, while maintaining progressive reading, it becomes possible to easily perform signal addition or signal thinning in the horizontal direction without causing even a drop of the detection sensitivity. That is, in the second embodiment, addition or thinning of signal charges of the parallel plurality of vertical (charge) transfer parts 212-1 to 212-4 is possible.

Further, in the second embodiment, pluralities of columns are defined as groups (four adjoining columns are defined as one group in the example in FIG. 16) and single through-vias (TSV) 241A are formed by bundling the columns in units of groups, therefore the number of through-vias can be decreased. This is also advantageous in layout. That is, in the second embodiment, provision of a sensor executing progressive reading from the pixel portions 211 at a high speed becomes possible, and the connecting parts, that is, the through-vias (TSV), are formed with a repetition pitch larger than that for the vertical transfer parts (vertical CCD) and charge storage parts (storage parts), therefore the formation of through-vias (TSV) etc. as the connecting part becomes easy.

Example of Configuration of Relay Selecting Part 250

Next, a concrete example of the configuration of the relay selecting part 250 will be explained.

Figure 17:
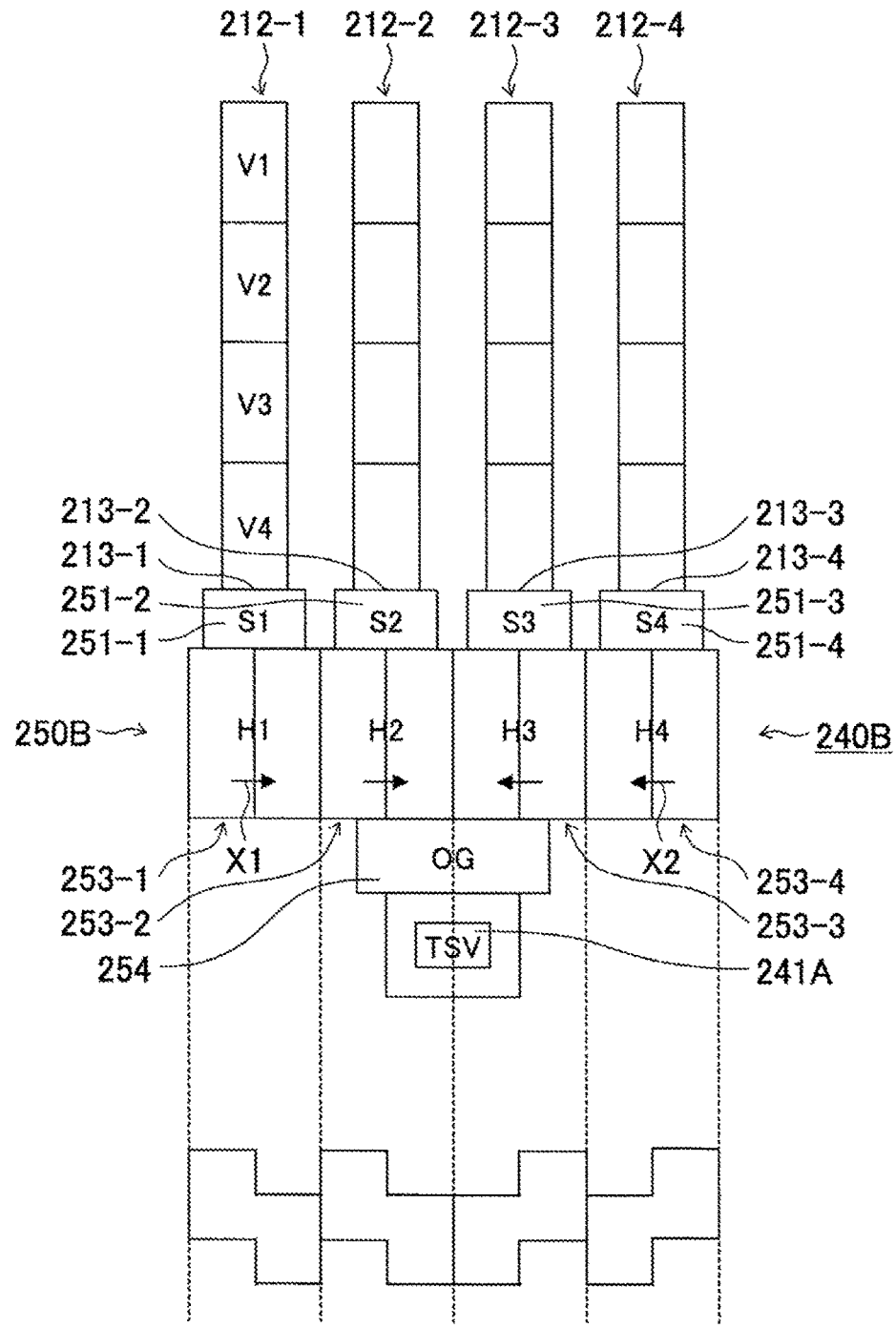
FIG. 17 is a view showing a first example of the configuration of a relay part including a relay selecting part on the first substrate side according to the second embodiment.

FIG. 17 is a view showing a first example of the configuration of a relay part including a relay selecting part on the first substrate side according to the second embodiment. In the relay selecting part 250B in the relay part 240B in FIG. 17, the through-via (TSV) 241A is formed at schematically the central part of the X-direction (horizontal direction) of the four columns of vertical transfer parts (VCCD) 212-1 to 212-4, that is, at the position between the array position of the vertical transfer part 212-2 in the second column and the array position of the vertical transfer part 212-3 in the third column. Further, the vertical transfer parts 212-1 to 212-4 in FIG. 17 are exemplified as 4-phase drives by driving pulses V1 to V4.

The relay selecting part 250B in FIG. 17 includes the selection electrodes 251-1 (S1) to 251-4 (S4), horizontal transfer parts (HCCD) 253-1 to 253-4, and open gate (OG) 254.

The selection electrodes 251-1 (S1) to 251-4 (S4) are arranged at the output end parts 213-1 to 213-4 of the vertical transfer parts (VCCD) 212-1 to 212-4. The selection electrodes 251-1 (S1) to 251-4 (S4) function as the gates of the transistors configuring the output gates etc. and are controlled to a potential so as to become a conductive state at the time of selection.

The horizontal transfer parts (HCCD) 253-1 to 253-4 are arranged so that they are positioned in the output parts of the individually corresponding selection electrodes 251-1 (S1) to 251-4 (S4) and are configured as the HCCDs which are different in the transfer direction directed to the OG 254 arranged at the center.

The horizontal transfer part 253-1 is arranged on the output side of the selection electrode 251-1 in the first column. The horizontal transfer part 253-1 is driven by the driving pulse H1, transfers the signal charges by the vertical transfer part 212-1 toward the right direction in FIG. 17, that is, the horizontal direction X1, and further transfers the same to the adjoining horizontal transfer part 253-2.

The horizontal transfer part 253-2 is arranged on the output side of the selection electrode 251-2 in the second column. The horizontal transfer part 253-2 is driven by the driving pulse H2, transfers the signal charges by the vertical transfer part 212-2 or the signal charges of the vertical transfer part 212-1 by the horizontal transfer part 253-1 toward the horizontal direction X1 which is the right direction in FIG. 17, and further transfers the same to the OG254 which is connected to its own stage.

The horizontal transfer part 253-4 is arranged on the output side of the selection electrode 251-4 in the fourth column. The horizontal transfer part 253-4 is driven by the driving pulse H4, transfers the signal charges by the vertical transfer part 212-4 toward the left direction in FIG. 17, that is, the horizontal direction X2, and further transfers the same to the adjoining horizontal transfer part 253-3.

The horizontal transfer part 253-3 is arranged on the output side of the selection electrode 251-3 in the third column. The horizontal transfer part 253-3 is driven by the driving pulse H3, transfers the signal charges by the vertical transfer part 212-3 or the signal charges of the vertical transfer part 212-4 by the horizontal transfer part 253-4 toward the left direction in FIG. 17, that is, the horizontal direction X2, and further transfers the same to the OG 254 which is connected to its own stage.

The OG 254 is arranged between the signal charge supply portion of the horizontal transfer part 253-2 and signal charge supply portion of the horizontal transfer part 253-3 and connecting part comprised of the through-via (TSV) 241A and is controlled to the conductive state, thereby transferring the signal charges which are selected by the selection electrodes 251-1 (S1) to 251-4 (S4) and are transferred through the horizontal transfer parts 253-1 to 253-4 to the through-via (TSV) 241A.

In this first example of the configuration as well, a configuration selecting the selection electrodes 251-1 to 251-4 and selection electrodes 252-1 to 252-4 one by one is also possible. However, for example, two or more selection electrodes may be simultaneously selected, a predetermined selection electrode may not be selected in a predetermined operation, and so on. Various embodiments are possible. Due to this, addition or thinning of the signal charges of the parallel plurality of vertical (charge) transfer parts 212-1 to 212-4 is possible without causing a drop of the detection sensitivity while maintaining progressive reading as it is. Further, according to the first example of the configuration, pluralities of columns (four in this example) are defined as groups and single through-vias (TSV) 241A are formed bundling the columns in units of groups, therefore the number of through-vias can be decreased. This is advantageous in layout as well. That is, according to the first example of the configuration, the provision of a sensor executing progressive reading from the pixel portions 211 at a high speed becomes possible, the connecting part comprised of the through-via (TSV) etc. are formed at a repetition pitch larger than that for the vertical transfer parts (vertical CCD) 212 and charge storage parts (storage parts), therefore the formation of the connecting part comprised of the through-via (TSV) etc. becomes easy.

Figure 18:
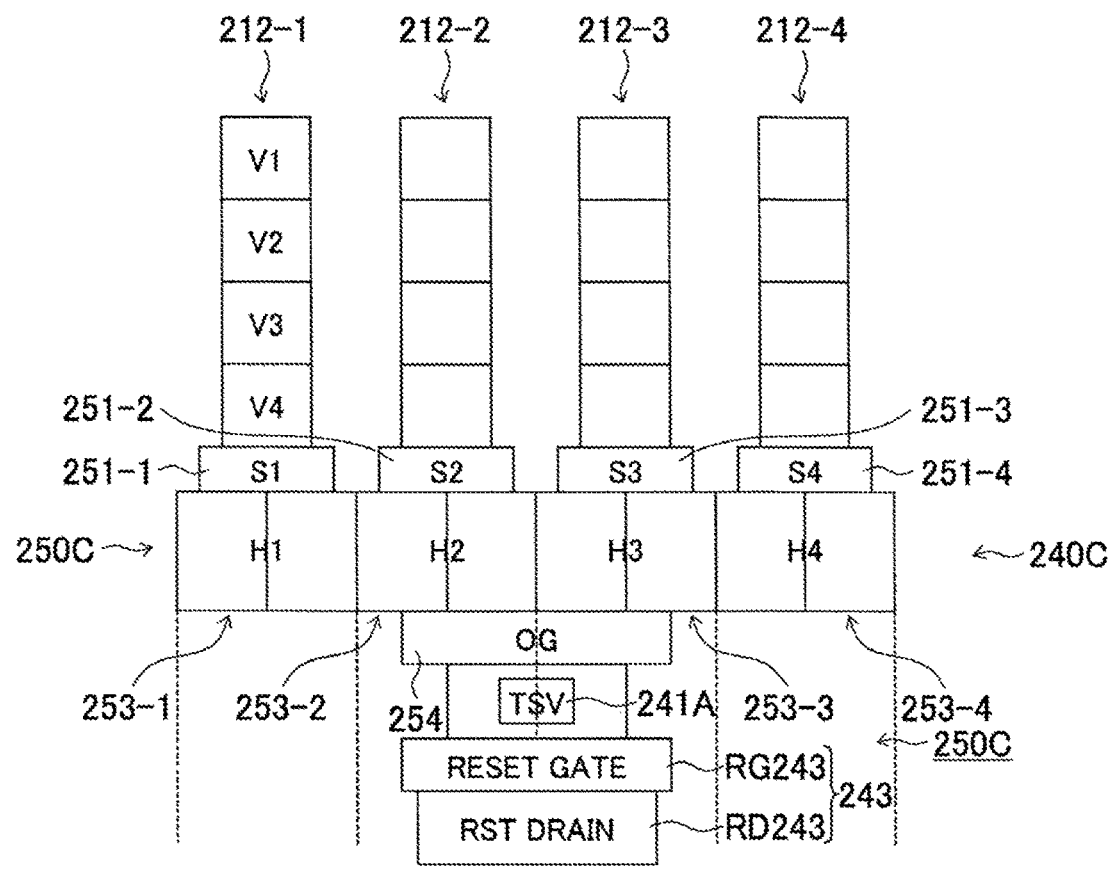
FIG. 18 is a view showing a second example of the configuration of a relay part including a relay selecting part on the first substrate side according to the second embodiment.

FIG. 18 is a view showing a second example of the configuration of the relay part including the relay selecting part on the first substrate side according to the second embodiment. The relay selecting part 250C in the relay part 240C in FIG. 18 is the same in the basic configuration as the relay selecting part 250B in FIG. 17. In the relay part 240C in FIG. 18, a reset transistor 243 having the reset gate RG243 and reset drain RD243 for setting the through-via (TSV) 241A to the intermediate potential when transferring signal charges by the through-via (TSV) 241A is formed.

According to the second example of the configuration, not only can the same effects as those by the first example of the configuration explained above be obtained, but also charge transfer through the TSV region in the case where the parasitic capacitance in the TSV region ($n^+$ region) between the transfer electrodes (transfer gates) is large becomes possible.

Figure 19:
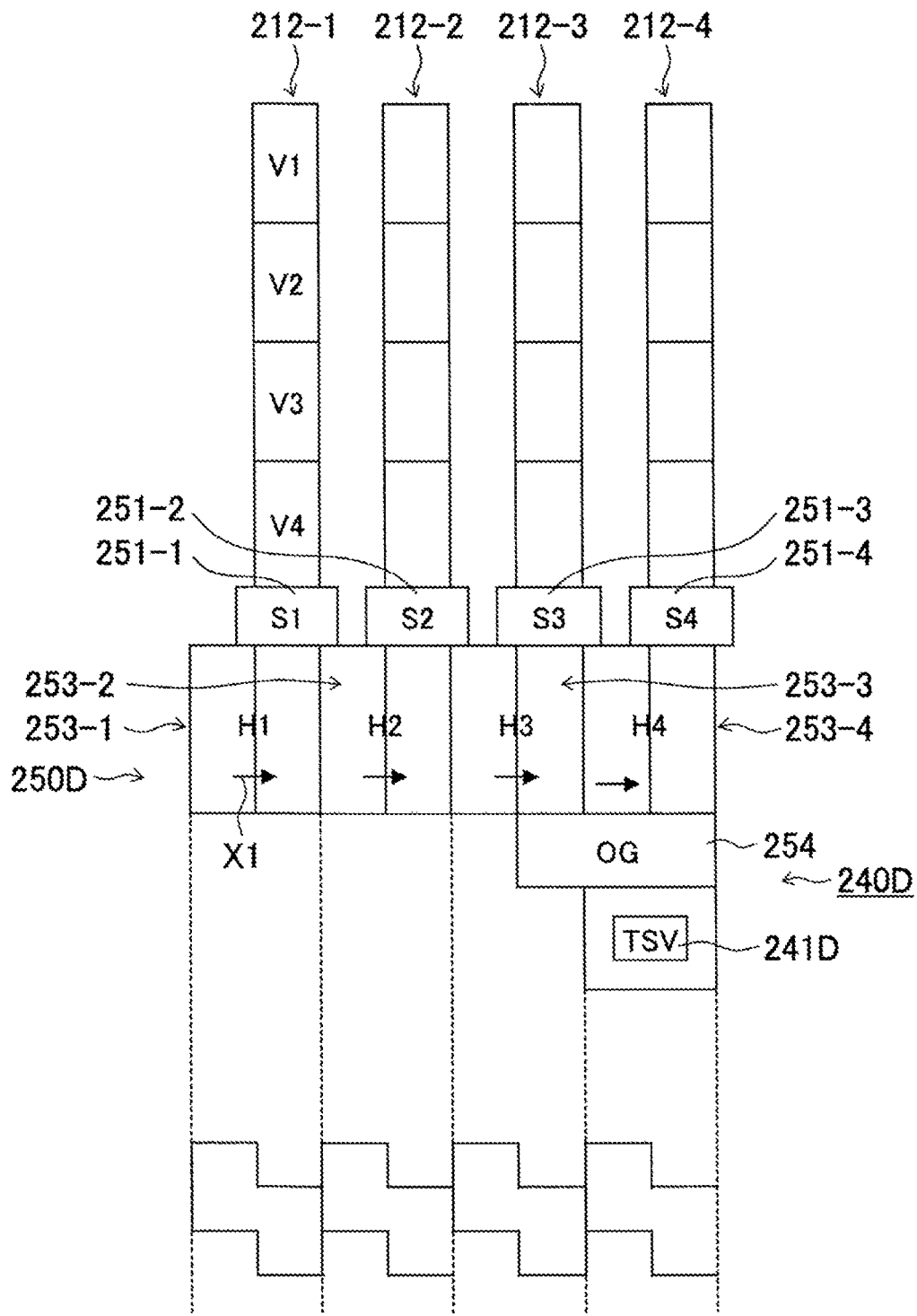
FIG. 19 is a view showing a third example of the configuration of a relay part including a relay selecting part on the first substrate side according to the second embodiment.

FIG. 19 is a view showing a third example of the configuration of the relay part including the relay selecting part on the first substrate side according to the second embodiment. The difference of the relay part 240D in FIG. 19 from the relay part 240B in FIG. 17 resides in that the array position of the through-via (TSV) 241D is not in the central part of the arrangement of the four columns of the vertical transfer parts 212-1 to 212-4, but it is formed in the vicinity of the array position of the vertical transfer part 212-4 in the fourth column at one end side of the X-direction (right end side in the example in FIG. 19).

In a relay selecting part 250D in FIG. 19, the horizontal transfer part 253-1 is driven by the driving pulse H1, transfers the signal charges by the vertical transfer part 212-1 toward the right direction in FIG. 19, that is, the horizontal direction X1, and further transfers the same to the adjoining horizontal transfer part 253-2.

The horizontal transfer part 253-2 is driven by the driving pulse H2, transfers the signal charges from the vertical transfer part 212-2 or the signal charges of the vertical transfer part 212-1 from the horizontal transfer part 253-1 toward the right direction in FIG. 19, that is, the horizontal direction X1, and further transfers the same to the adjoining horizontal transfer part 253-3.

The horizontal transfer part 253-3 is driven by the driving pulse H3, transfers the signal charges from the vertical transfer part 212-3 or the signal charges of the vertical transfer parts 212-1 and 212-2 from the horizontal transfer part 253-2 toward the right direction in FIG. 19, that is, the horizontal direction X1, and further transfers the same to the adjoining horizontal transfer part 253-4.

The horizontal transfer part 253-4 is driven by the driving pulse H4, transfers the signal charges from the vertical transfer part 212-4 toward the right direction in FIG. 19, that is, the horizontal direction X1, and supplies the signal charges of the vertical transfer part 212-4 or the signal charges of the vertical transfer parts 212-1, 212-2, and 212-3 by the horizontal transfer part 253-3 to the OG 254 which is connected to its own stage.

The OG 254 is arranged between the signal charge supply portion of the horizontal transfer part 253-4 and the connecting part comprised of the through-via (TSV) 241D and is controlled to the conductive state to thereby transfer the signal charges which are selected by the selection electrodes 251-1 (S1) to 251-4 (S4) and are transferred through the horizontal transfer parts 253-1 to 253-4 to the through-via (TSV) 241D.

According to the third example of the configuration, the same effects as those by the first example of the configuration explained above can be obtained.

Figure 20:
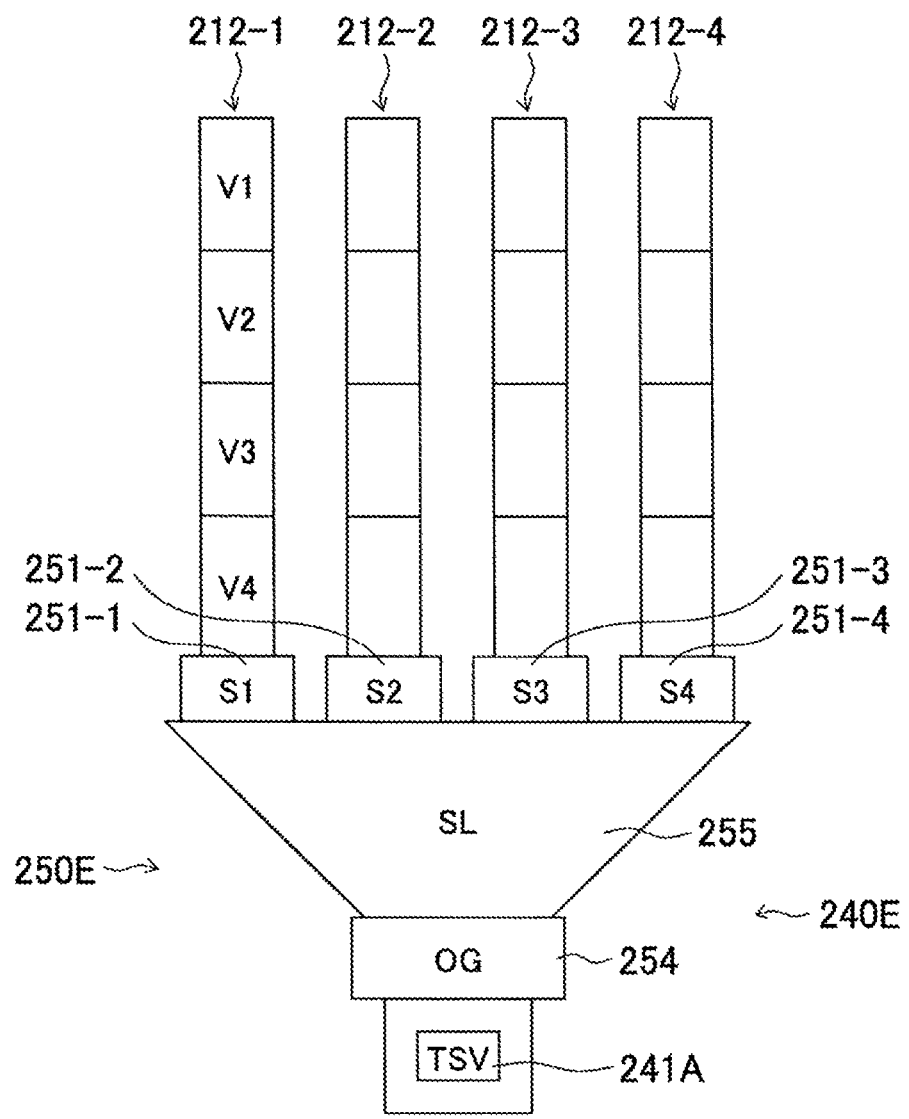
FIG. 20 is a view showing a fourth example of the configuration of a relay part including a relay selecting part on the first substrate side according to the second embodiment.

FIG. 20 is a view showing a fourth example of the configuration of the relay part including the relay selecting part on the first substrate side according to the second embodiment.

The difference of a relay selecting part 250E in a relay part 240E in FIG. 20 from the relay selecting part 250B in FIG. 17 resides in that a potential slope portion (SL) 255 is provided in place of the horizontal transfer part. In this relay selecting part 250E, the signal charges of the vertical transfer parts 212-1 to 212-4 selected by the selection electrodes 251-1 (S1) to 251-4 (S4) pass through the potential slope portion 255 and are further transferred through the OG 254 to the through-via (TSV) 241A.

According to the fourth example of the configuration, the same effects as those by the first example of the configuration explained above can be obtained.

An explanation was given above of the first to fourth examples of the configuration of the relay part including the relay selecting part on the first substrate side. These configurations, basically, can be employed as the relay selecting parts on the second substrate 120 side. Note, the transfer direction of signal charges becomes inverse directions to those in the cases related to FIG. 17 to FIG. 20. In other words, the signal charges transferred through the through-vias (TSV) are transferred through the OG 254 to the horizontal transfer parts 253-1, 253-2, 253-3, and 253-4 or through the potential slope portion 255 to the desired position, are selected at the selection electrodes 252-1 to 252-4, and are transferred to the charge storage parts 220-1 to 220-4.

Third Embodiment

Figure 21:
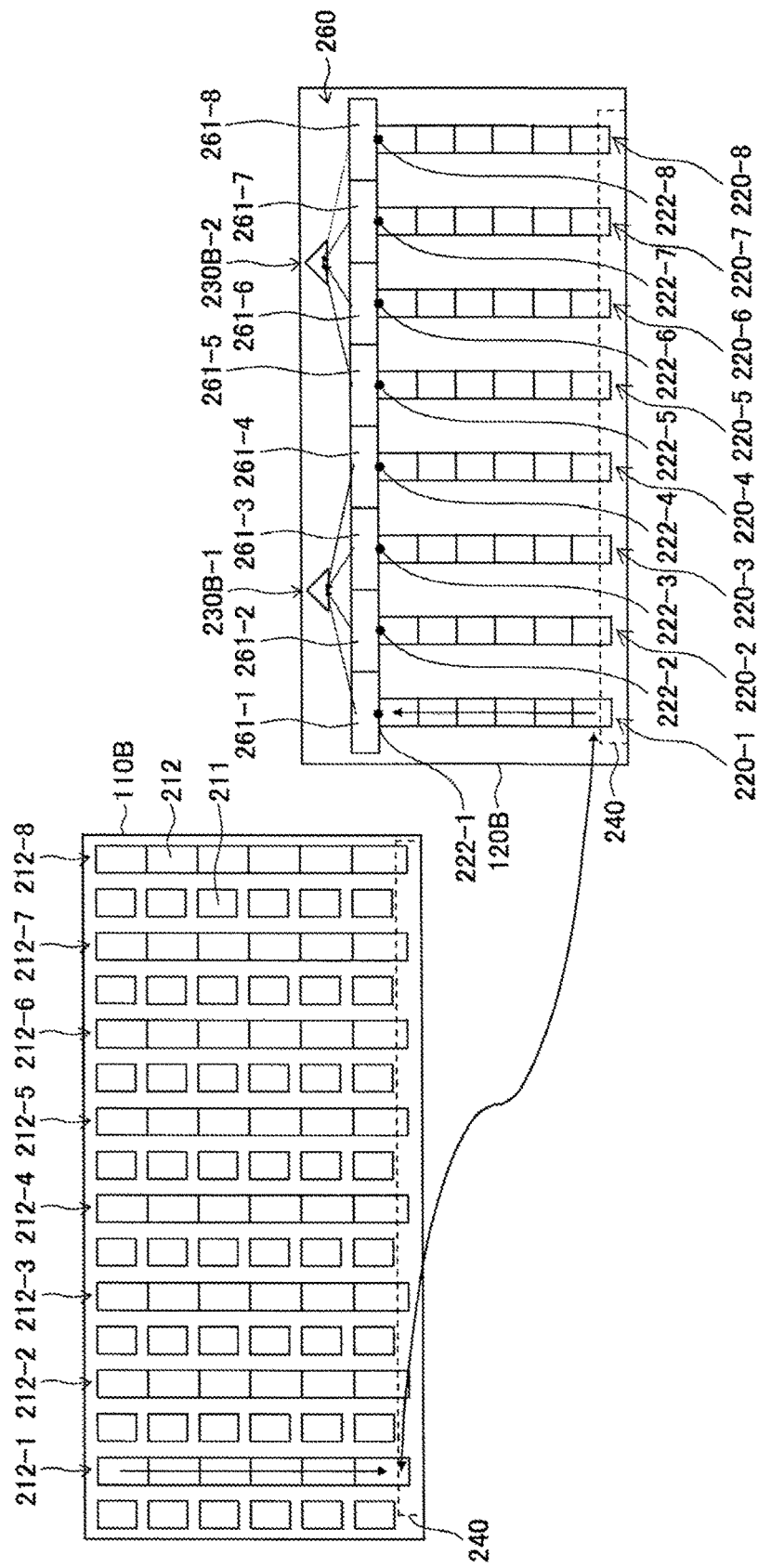
FIG. 21 is a view for explaining an example of the configuration of a solid-state imaging device according to a third embodiment of the present invention.

FIG. 21 is a view for explaining an example of the configuration of a solid-state imaging device according to a third embodiment of the present invention.

The difference of a solid-state imaging device 100B according to the third embodiment from the solid-state imaging device 100 in the first embodiment explained above is as follows. The solid-state imaging device 100B according to the third embodiment is configured by including, on the second substrate 120B side, an output selecting part 260 which selectively connects the plurality of charge storage parts 220-1 to 220-4 and 220-5 to 220-8 and the output parts 230B-1 and 230B-2.

In the solid-state imaging device 100B in the third embodiment, in the photosensitive part 210B formed on the first substrate 110B, pixel portions 211 and vertical transfer parts 212 are arranged in a matrix comprised of six rows and eight columns. So as to correspond to this, on the second substrate 120B, eight columns of charge storage parts 220-1 to 220-8 are formed. On the second substrate 120B, in the output end parts 222-1 to 222-4 and 222-5 to 222-8 of the charge storage parts 220-1 to 220-4 and 220-5 to 220-8, the selection electrodes 261-1 to 261-4 and 261-5 to 261-8 are arranged (formed). Further, on the second substrate 120B, one set of output parts 230B-1 and 230B-2 is formed with respect to the plurality of selection electrodes 261-1 to 261-4, and 261-5 to 261-8.

In FIG. 21, the signal charges which are transferred through the vertical transfer parts 212-1 to 212-8 on the first substrate 110B side are transferred through the relay part 240 to the charge storage parts (storage parts) 220-1 to 220-4 and 220-5 to 220-8 on the second substrate 120B side. Further, the signal charges transferred to the charge storage parts 220-1 to 220-4 and 220-5 to 220-8 are supplied to the corresponding output parts 230B-1 and 230B-2 as in the following way.

The signal charges in the charge storage part 220-1 are selected by the selection electrode 261-1 and are supplied to the output part 230B-1. The signal charges in the charge storage part 220-2 are selected by the selection electrode 261-2 and are supplied to the output part 230B-1. The signal charges in the charge storage part 220-3 are selected by the selection electrode 261-3 and are supplied to the output part 230B-1. The signal charges in the charge storage part 220-4 are selected by the selection electrode 261-4 and are supplied to the output part 230B-1. The signal charges in the charge storage part 220-5 are selected by the selection electrode 261-5 and are supplied to the output part 230B-2. The signal charges in the charge storage part 220-6 are selected by the selection electrode 261-6 and are supplied to the output part 230B-2. The signal charges in the charge storage part 220-7 are selected by the selection electrode 261-7 and are supplied to the output part 230B-2. The signal charges in the charge storage part 220-8 are selected by the selection electrode 261-8 and are supplied to the output part 230B-2.

In the third embodiment, pluralities of columns are defined as groups (four adjoining columns are defined as one group in the example in FIG. 21) and single sets of output parts 230B-1 and 230B-2 are formed by bundling the columns in units of groups, therefore the number of output parts can be decreased. This is also advantageous in layout. That is, in the third embodiment, the provision of a sensor executing progressive reading from the pixel portions 211 at a high speed becomes possible, and the output parts are formed with a repetition pitch larger than that for the charge storage parts (storage parts), therefore the formation of the output parts becomes easy. Further, in the third embodiment, addition or thinning of signal charges in the parallel plurality of charge storage parts 220-1 to 220-4 and 220-5 to 220-8 is possible.

Further, in the third embodiment as well, by employing the relay selecting parts in the second embodiment explained above, it becomes possible to easily perform signal addition or signal thinning in the horizontal direction without causing a drop of the detection sensitivity while maintaining the progressive reading as it is.

Note that, in the second embodiment, an explanation was given of first to fourth examples of the configuration of the relay parts including the relay selecting parts on the first substrate side. These configurations, basically, can be employed as the output selecting part 260 on the second substrate 120B side in the third embodiment. In this case, the portions of the through-vias (TSV) become the input parts of the output parts 230B-1 and 230B-2.

Fourth Embodiment

Figure 22:
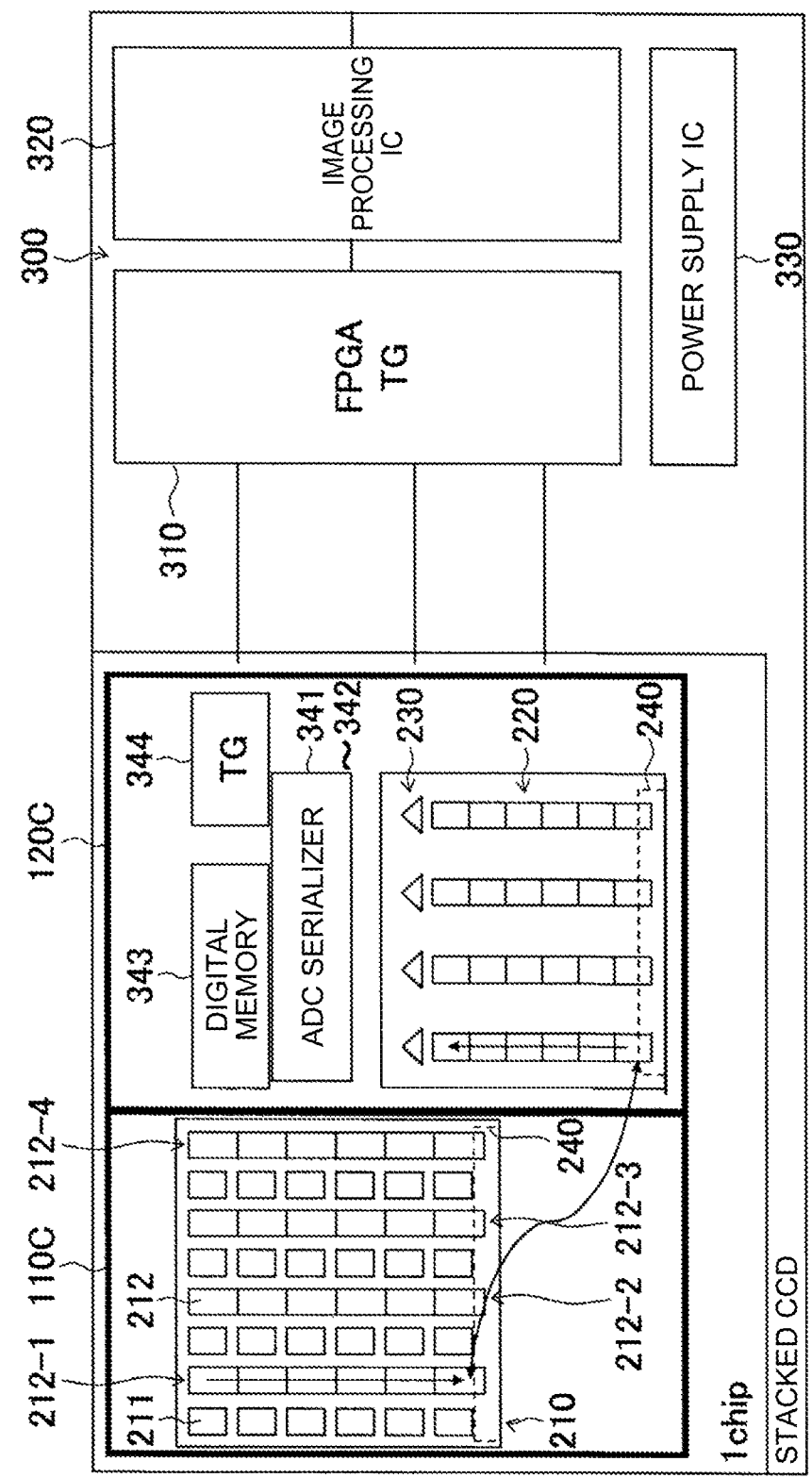
FIG. 22 is a view for explaining an example of the configuration of a solid-state imaging device according to a fourth embodiment of the present invention.

FIG. 22 is a view for explaining an example of the configuration of a solid-state imaging device according to a fourth embodiment of the present invention.

The difference of a solid-state imaging device 100C according to the fourth embodiment from the solid-state imaging device 100 in the first embodiment explained above is as follows. In the solid-state imaging device 100C according to the third embodiment, on the second substrate 120C, in addition to the charge storage parts 220 and output parts 230, the analog-to-digital converter (ADC) 341, serializer 342, memory 343, and timing generator (TG) 344 of the signal processing system comprised of the peripheral circuit part are formed. The timing generator (TG) 344 includes a CCD pulse driving part and level shift etc.

Here, using a CMOS image sensor as a comparative example, the chip sizes of a CCD image sensor and a CMOS image sensor used as the solid-state imaging device 100C according to the fourth embodiment mounting the signal processing system on the second substrate 120C will be considered.

Figure 23A:
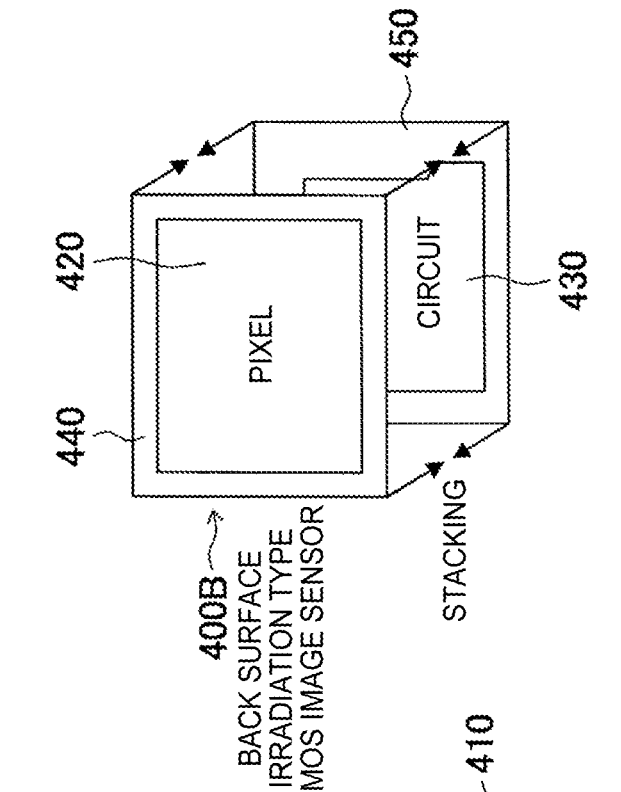
FIG. 23A to FIG. 23B are views showing an example of a stacked structure of a back-surface irradiation type CMOS image sensor as a comparative example.
Figure 23B:
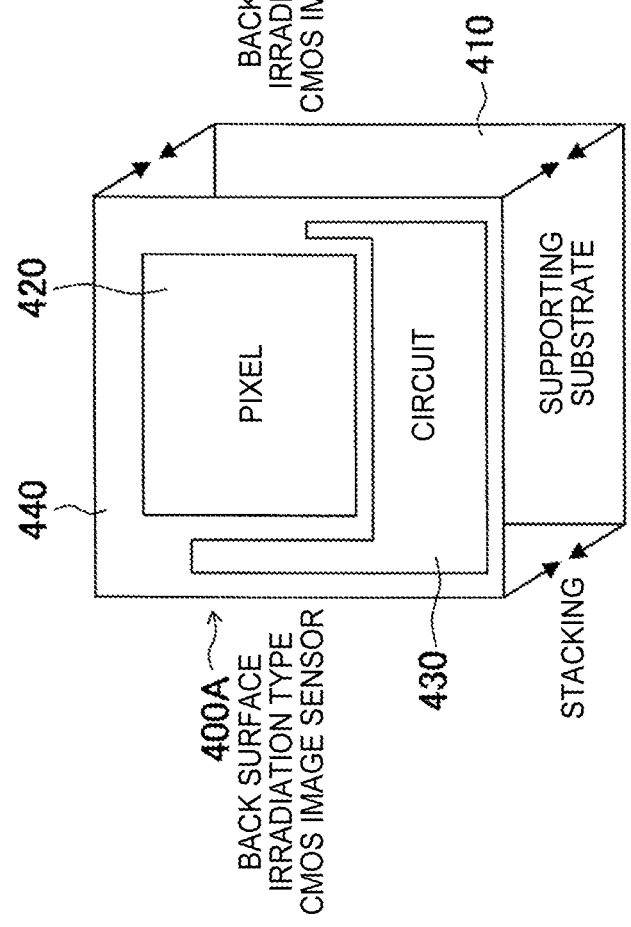

FIGS. 23A and 23B are views showing examples of the stacked structure of a comparative example comprised of a back surface irradiation type CMOS image sensor. FIG. 23A shows a first example of the configuration of the CMOS image sensor, and FIG. 23B shows a second example of the configuration of the CMOS image sensor stacked. FIGS. 24A and 24B are views for explaining an example of chip reduction using a stacked structure of the CMOS image sensor. FIG. 24A shows a pixel portion and peripheral circuit in the case where there is no stacked structure, and FIG. 24B shows an example where reduction is achieved by a stacked structure. FIGS. 25A to 25C are views showing simplified cross-sections of a CMOS image sensor chip which does not have a stacked structure, a CMOS image sensor chip having a stacked structure, and a CCD image sensor chip according to the present embodiment. FIG. 25A shows a CMOS image sensor chip which does not have a stacked structure, FIG. 25B shows an CMOS image sensor chip having a stacked structure, and FIG. 25C shows a CCD image sensor chip according to the present embodiment.

In general, a CMOS image sensor 400A, as shown in FIG. 23A, is configured by a supporting substrate 410 and a chip 440 on which a pixel portion 420 and signal processing circuit 430 are formed. The stacked type structure, as shown in FIG. 23B, uses a chip 450 on which the signal processing circuit 430 is formed in place of the supporting substrate, and the pixel portion 420 is superimposed on that. By employing this stacked structure, reduction of size can be realized.

In such a CMOS image sensor, the peripheral circuit comprised of the signal processing circuit 430, as shown in FIG. 24A, is configured by a row decoder (ROW decode) 431, column decoder (column decode) 432, or row (column) selection circuit, bonding pads 433, and so on. By arranging the signal processing circuit 530 as the peripheral circuit in the second layer, as shown in FIG. 24B, the peripheral circuit region can be deleted. However, in order to make the pixel driving signal-use signal from the row decoder 431 pass through the through-via (TSV) for each row, the TSV region newly becomes necessary for each row or column.

As a result, by employing a stacked structure, for example as shown in FIGS. 25A and 25B, the CMOS image sensor chip, while depending on the configuration, can reduce the chip size to about a half compared with the case where the stacked structure is not employed. However, as shown in FIGS. 25B and 25C, even when the CMOS image sensor chip uses the stacked structure as explained above, the TSV region newly becomes necessary for each row and column or the like, while depending on the configuration, for example, the size becomes about 1.5 times larger than the CCD image sensor chip according to the present embodiment.

In other words, in the CCD image sensor according to the present embodiment, interlayer connection through a connecting part comprised of a through-via (TSV) becomes possible, therefore wire bonding becomes unnecessary, so a small-sized package of a die size level becomes possible, thus by connection of for example BGA, compact camera module mounting becomes possible. In this way, by mounting of the present stacked CCD package, an ultra-small sized camera module can be realized.

Further, a plurality of structures providing a global shutter in a CMOS image sensor have been proposed in NPLT etc. However, in each example, it is necessary to add a special circuit in the pixel array causing the demerits that a drop of the sensitivity and increase of noise are caused. Further, in the example of improvement in the conventional CMOS, there were the defects that, when selecting a structure performing signal addition, the SN ratio deteriorates due to an increase of the parasitic capacitance, and the simultaneity of signals is degraded. Contrary to this, in the CCD image sensor according to the present embodiment, high speed driving with global reading becomes possible without forming a special structure in the pixel array, that is, without causing deterioration of the SN ratio. Further, a die size package using inter-chip connection of the through-vias (TSV) becomes possible. Further, by decreasing the number of drive pins by mounting of the peripheral circuit on the second substrate, it becomes possible to provide a camera system having a high performance, small size, and low cost.

Fifth Embodiment

Figure 26:
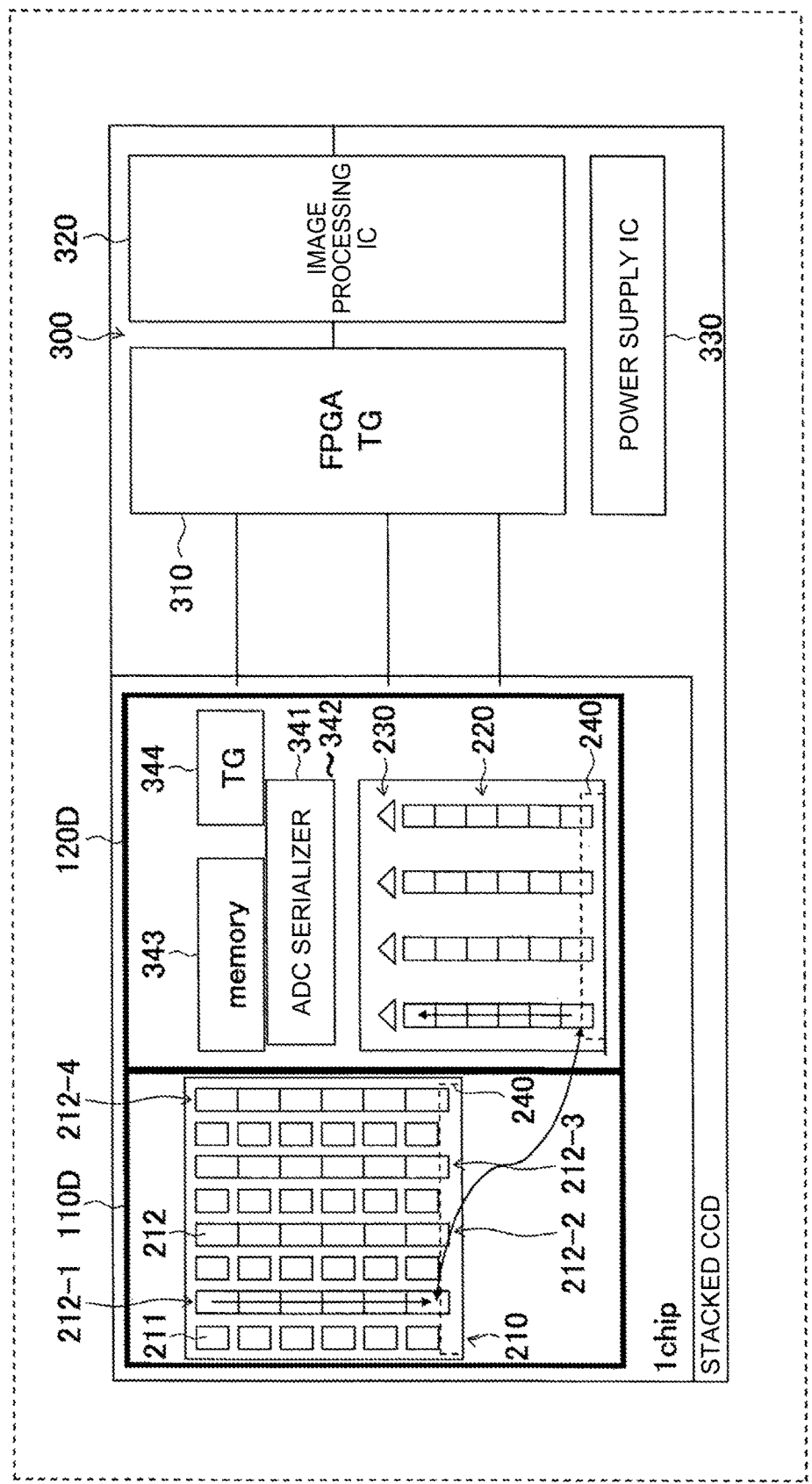
FIG. 26 is a view for explaining an example of the configuration of a solid-state imaging device according to a fifth embodiment of the present invention.

FIG. 26 is a view for explaining an example of the configuration of a solid-state imaging device according to a fifth embodiment of the present invention.

The difference of a solid-state imaging device 100D according to the fifth embodiment from the solid-state imaging device 100C in the fourth embodiment explained above is as follows. In the solid-state imaging device 100D according to the fifth embodiment, a signal processing part 300 including a timing generator 310, image processing circuit (image processing IC) 320, and power supply circuit (power supply IC) 330 is mounted on the same package as that for the first substrate 110D and second substrate 120D.

By configuring the device in this way, it also becomes possible to incorporate a small-sized camera system in a single package.

Sixth Embodiment

Figure 27:
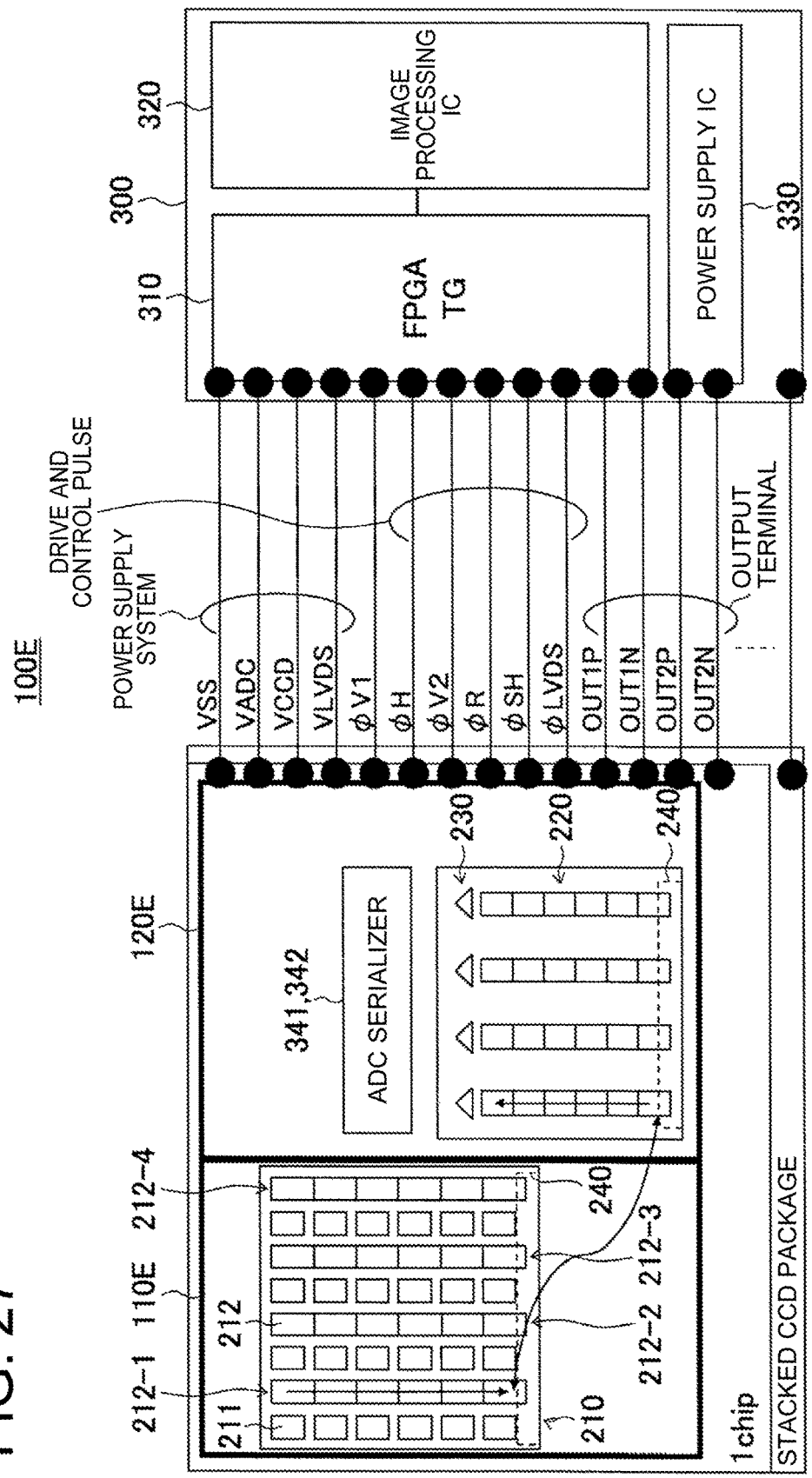
FIG. 27 is a view for explaining an example of the configuration of a solid-state imaging device according to a sixth embodiment of the present invention.

FIG. 27 is a view for explaining an example of the configuration of a solid-state imaging device according to a sixth embodiment of the present invention.

The difference of a solid-state imaging device 100E according to the sixth embodiment from the solid-state imaging device 100C of the fourth embodiment explained above is as follows. In the solid-state imaging device 100E according to the sixth embodiment, on a second substrate 120E, in addition to the charge storage parts 220 and output parts 230, the ADC 341 and serializer 342 of the signal processing system comprised of the peripheral circuit are formed and mixed. The rest of the configuration is the same as that in the fourth embodiment.

FIG. 27 shows transmission lines of a power supply system, a drive and driving pulse system, and an output terminal system for transmission and reception between the signal processing part 300 and the stacked chip. The driving pulse and power supply which are necessary for the driving are for example the reference power supply VSS (GND), CCD-use power supply VCCD, ADC-use power supply VADC, serial output-use power supply VLVDS, vertical transfer pulses $\phi V1$ and $\phi V2$, horizontal transfer pulse $\phi H$, readout pulse $\phi R$ from the pixel to the vertical transfer part, serial output-use reference clock $\phi LVDS$, CCD output-use sample/hold pulse $\phi SH$, and serial signal output signal. To the transmission lines of these signals, an external substrate (external board) on which the signal processing part 300 configured by an FPGA etc. is mounted is connected to the pins.

Note that, in the solid-state imaging device 100E in the present embodiment, the horizontal transfer is not carried out, but horizontal transfer is locally carried out in a case where the horizontal transfer parts are employed in the relay selecting part 250 and output selecting part, therefore a function of generating a horizontal transfer pulse $\phi H$ as the driving pulse is given.

FIGS. 28A to 28E are views showing an example of timing of a drive signal of the solid-state imaging device used as a stacked type CCD image sensor according to the sixth embodiment. FIG. 28A shows the charge readout pulse ϕR, FIG. 28B shows the vertical transfer pulse ϕV2, FIG. 28C shows the vertical transfer pulse ϕ V1, FIG. 28D shows the horizontal transfer pulse ϕH, and FIG. 28E shows the buffer output VOUT.

In the solid-state imaging device 100E in FIG. 27, the CCD driving pulses ϕV1 and ϕV2 are input as external signals. The synchronized image data is converted to serial digital output and output by the built-in ADC 341 and serializer 342, is taken into for example the FPGA 310 on another substrate, and is processed as video signals.

According to the sixth embodiment, the same effects as the effects by the fourth embodiment explained above can be obtained. Further, in the solid-state imaging device 100E in the sixth embodiment, on the first substrate 110E, the vertical transfer parts (vertical CCD) are adjacent to the pixel portions 211, therefore progressive reading is possible. The pixel portions are CCDs. Therefore, the through-vias (TSV) which are connected to the second substrate 120E (second layer) can be greatly reduced compared with the case where the through-vias are stacked on the second layer which is mainly configured as the peripheral circuit of the CMOS image sensor so that they are connected for each row. For example, the through-vias can be arranged only vertically at the chip, therefore it becomes possible to reduce the package size.

Seventh Embodiment

Figure 29:
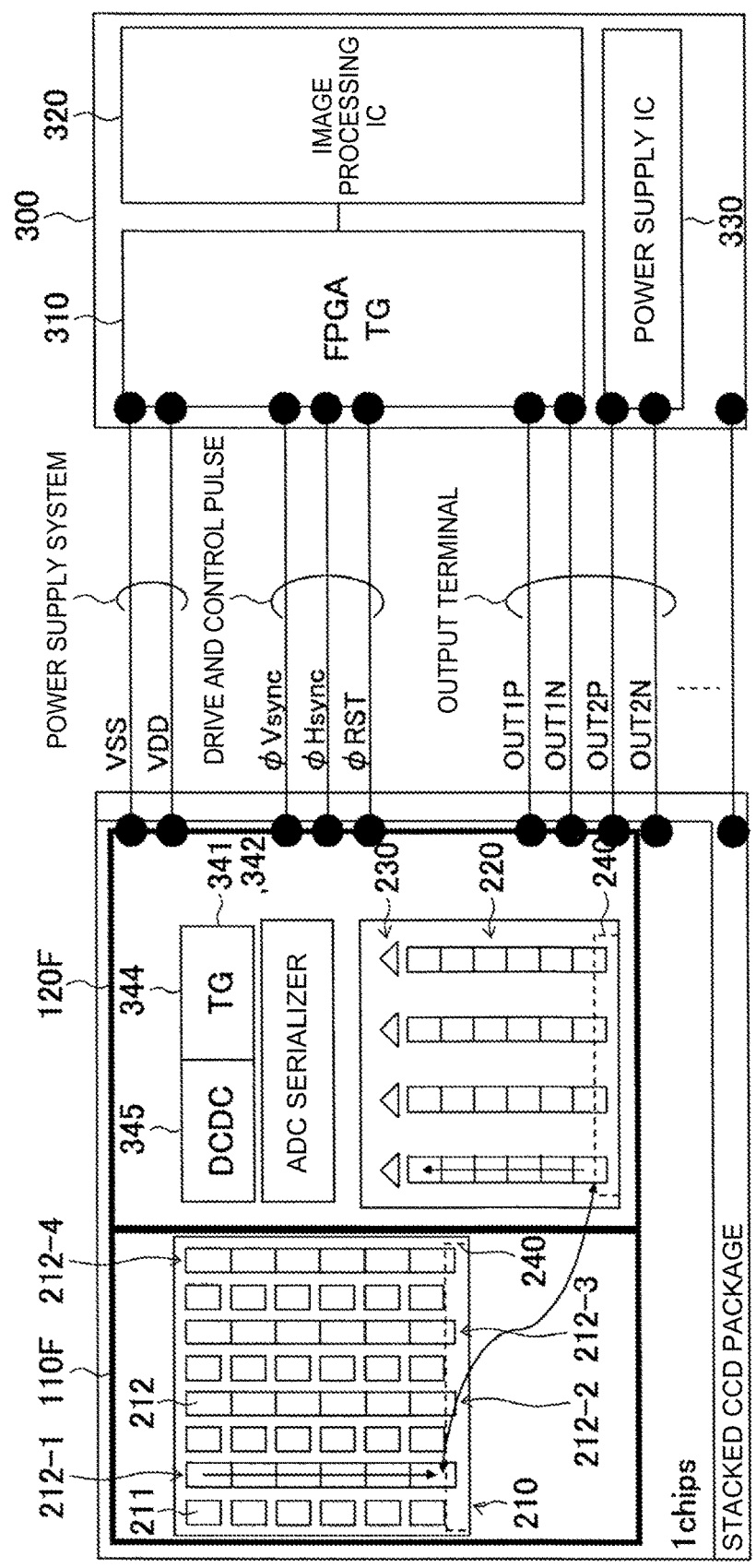
FIG. 29 is a view for explaining an example of the configuration of a solid-state imaging device according to a seventh embodiment of the present invention.

FIG. 29 is a view for explaining an example of the configuration of a solid-state imaging device according to a seventh embodiment of the present invention.

The difference of a solid-state imaging device 100F according to the seventh embodiment from the solid-state imaging device 100E in the sixth embodiment explained above is as follows. In the solid-state imaging device 100F according to the seventh embodiment, on a second substrate 120F, in addition to the ADC 341 and serializer 342 of the signal processing system of the peripheral circuit, a driving pulse generator comprised of a timing generator (TG) 344 and a voltage generation circuit comprised of a DCDC converter (DCDC) 345 are mounted.

In the solid-state imaging device 100F according to the seventh embodiment, by mounting the timing generator (TG) 344 and DCDC converter (DCDC) 345, it becomes possible to decrease the pins which are necessary for the connection by for example defining the external driving pulses as ϕVsync (V trigger pulse), ϕHsync (H trigger pulse), and ϕRST (reset pulse), and setting VDD and VSS as the power supply.

According to the seventh embodiment, in addition to the same effects as the effects by the sixth embodiment explained above, the following effects can be obtained. That is, according to the seventh embodiment, the number of drive pins can be decreased. Therefore, by arranging the peripheral circuit on the second substrate 120F, there is the advantage that this embodiment can be applied to an electronic apparatus which is used for an application restricted as to mounting size, number of connectable cables, cable lengths, installation heights, and so on in view of requirements for installation of the camera such as, for example, a monitoring camera, medical endoscope-use camera, or the like.

Eighth Embodiment

Figure 30:
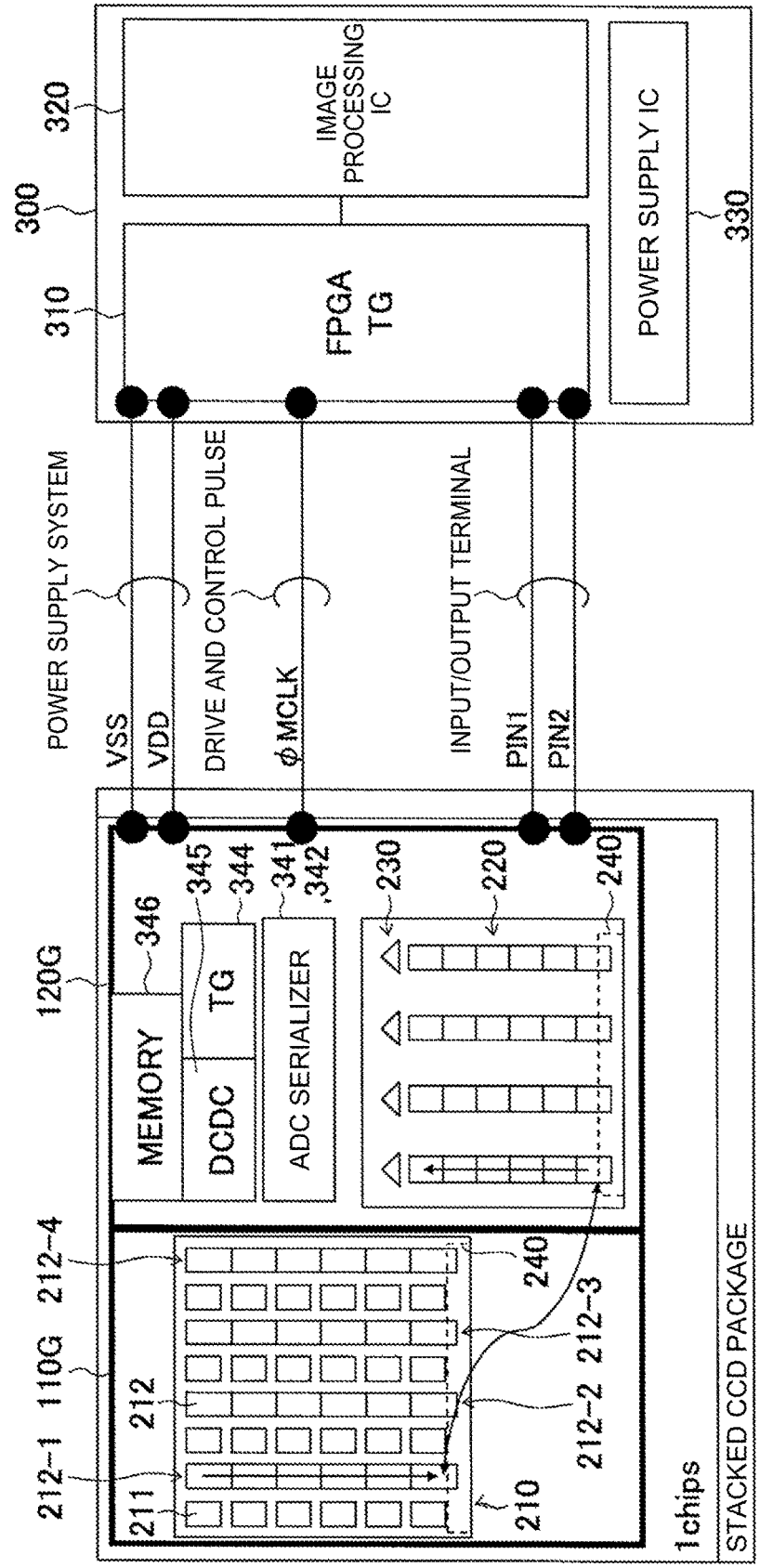
FIG. 30 is a view for explaining an example of the configuration of a solid-state imaging device according to an eighth embodiment of the present invention.

FIG. 30 is a view for explaining an example of the configuration of a solid-state imaging device according to an eighth embodiment of the present invention.

The difference of a solid-state imaging device 100G according to the eighth embodiment from the solid-state imaging device 100F in the sixth embodiment explained above is as follows. In the solid-state imaging device 100G according to the eighth embodiment, on a second substrate 120G, in addition to the ADC 341, serializer 342, timing generator (TG) 344, and DCDC converter (DCDC) 345 of the signal processing system of the peripheral circuit part, a memory 346 is mounted. Further, in the solid-state imaging device 100G according to the eighth embodiment, by making the power supply function by the switch, the terminals PIN1 and PIN2 for the driving pulse and output signal pulse are shared.

Figure 31:
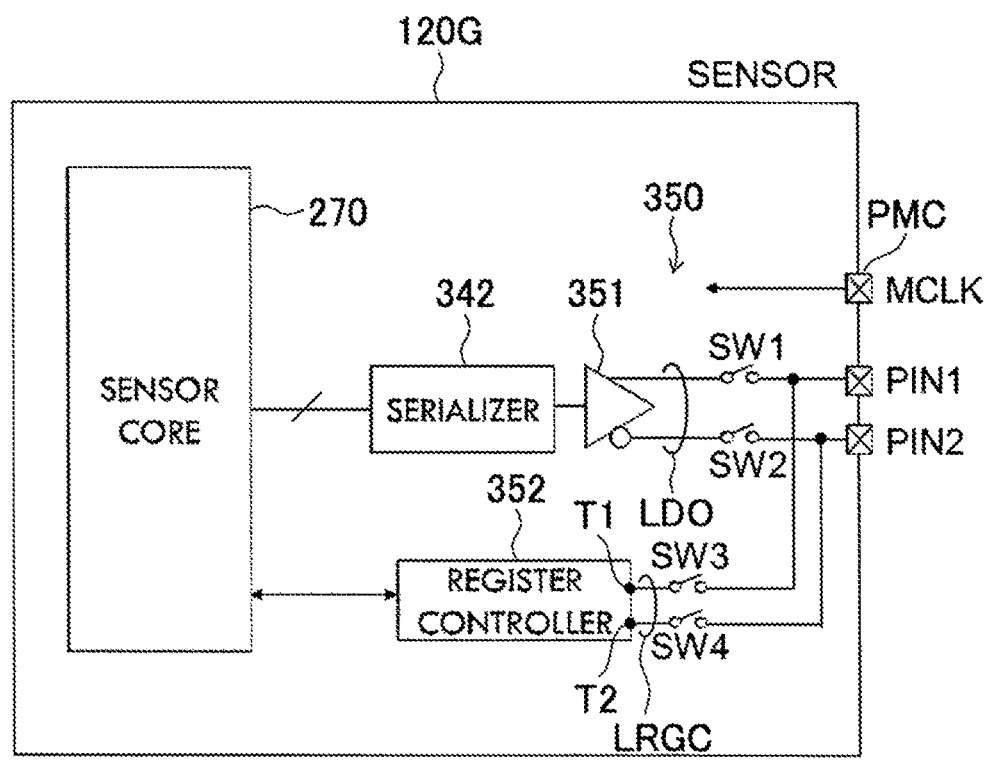
FIG. 31 is a view showing an example of the configuration for realizing sharing of terminals for a driving pulse and output signal pulse in the solid-state imaging device according to the eighth embodiment.

Example of Configuration for Realizing Sharing of Terminals for Driving Pulse and Output Signal Pulse Here, an explanation will be given of the example of configuration for realizing sharing of the terminals PIN1 and PIN2 for driving pulse and output signal pulse in the solid-state imaging device 100G according to the eighth embodiment. FIG. 31 is a view showing an example of the configuration for sharing of the terminals for the driving pulse and output signal pulse in the solid-state imaging device 100G according to the eighth embodiment.

In FIG. 31, a sharing circuit 350 of the terminals for the driving pulse and output signal pulse on the second substrate 120G is extracted and shown. Further, a sensor core 270 including the output part of the imaging element part 200G and a not shown driving system etc. is shown.

On the second substrate 120G in FIG. 31, a master clock-use terminal PMC and incident input/output terminals PIN1 and PIN2 are formed. The sharing circuit 350 in FIG. 31 has a differential output circuit 351, register controller 352, and switches SW1 to SW4. In this sharing circuit 350, the input/output terminals PIN1 and PIN2 are shared by the register control line LRGC and data output line LDO. The sharing circuit 350 switches them by the switches SW1 to SW4.

In the sharing circuit 350, the input part of the differential output circuit 351 is connected to the output part of the serializer 342, the positive side output part of the differential output circuit 351 is connected through the switch SW1 to the input/output terminal PIN1, and the negative side output part is connected through the switch SW2 to the input/output terminal PIN2. A first input/output terminal T1 of the register controller 352 is connected through the switch SW3 to the input/output terminal PIN1, and a second input/output terminal T2 is connected through the switch SW4 to the input/output terminal PIN2.

Figure 32:
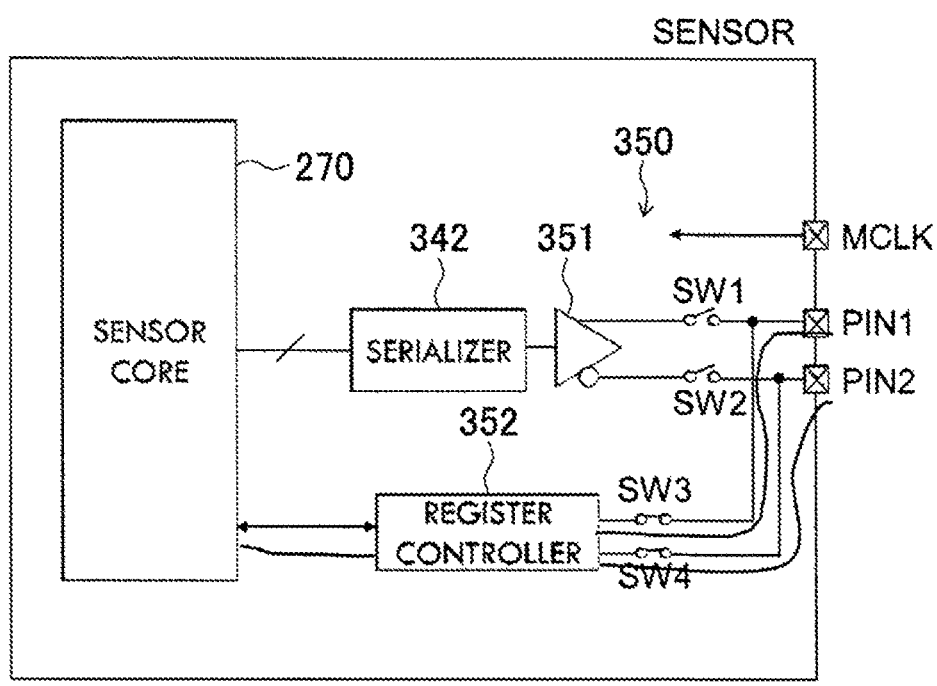
FIG. 32 is a view for explaining an operation at the time of a register control mode of the sharing circuit according to the eighth embodiment.
Figure 33:
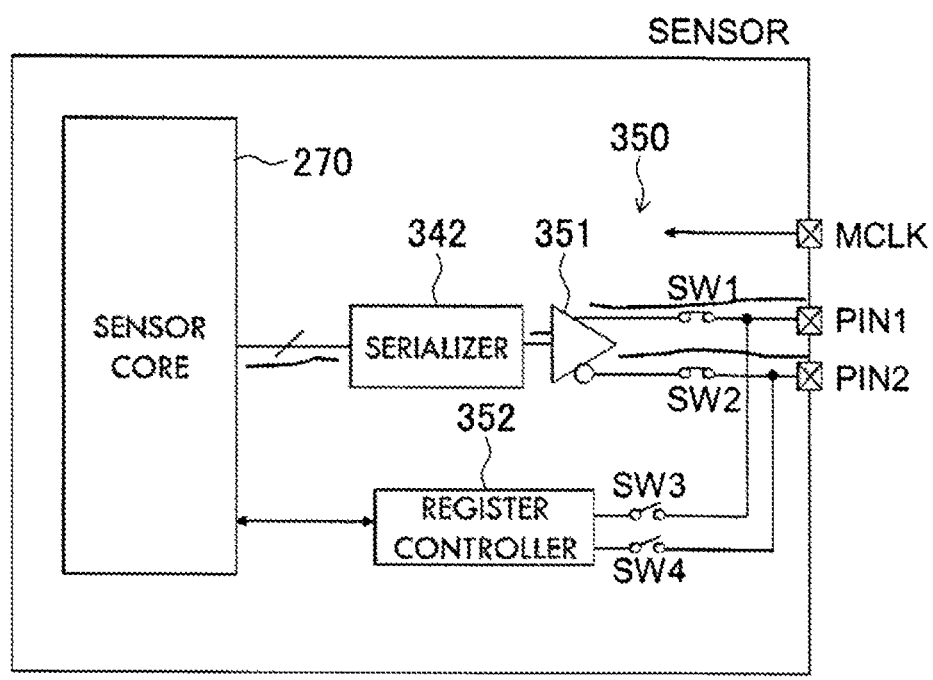
FIG. 33 is a view for explaining the operation at the time of an image data streaming mode of the sharing circuit according to the eighth embodiment.
Figure 34:
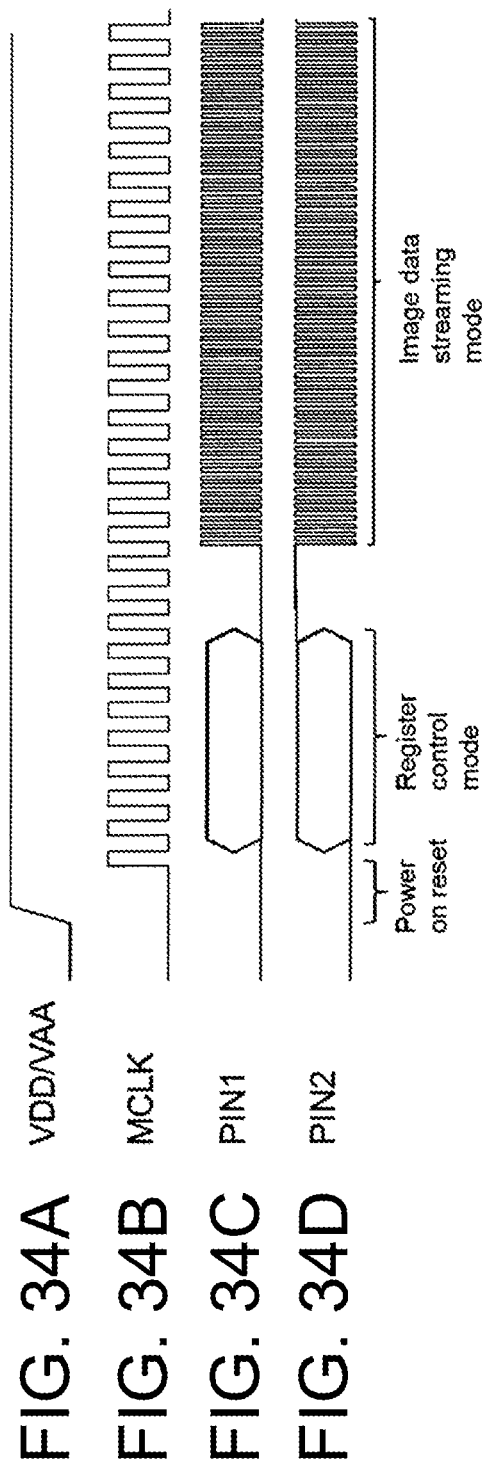
FIG. 34 A to FIG. 23D are timing charts for explaining operations at the time of a register control mode and the time of an image data streaming mode of the sharing circuit according to the eighth embodiment.

Next, an example of operations of the sharing circuit will be explained related to FIG. 32 to FIG. 34. FIG. 32 is a view for explaining the operation of the sharing circuit according to the eighth embodiment at the time of a register control mode. FIG. 33 is a view for explaining the operation of the sharing circuit according to the eighth embodiment at the time of an image data streaming mode. FIGS. 34A to 34D are timing charts for explaining the operations of the sharing circuit according to the eighth embodiment at the time of a register control mode and time of an image data streaming mode. FIG. 34A shows the power supply voltage VDD/VAA, FIG. 34B shows the reference clock (master clock) MCLK, FIG. 34C shows the signal of the input/output terminal PIN1, and FIG. 34D shows the signal of the input/output terminal PIN2.

After turning on the power, after the power on reset, as shown in FIG. 32, the switches SW3 and sW4 become ON, and the operation enters into the register control mode. In this case, the register is rewritten by using the input/output terminals PIN1 and PIN2, and the sensor is set. After that, the register is set by switching the sensor to the image output mode. As shown in FIG. 33, the switches SW3 and SW4 are turned OFF and the switches SW1 and SW2 are turned ON, then the register control mode is ended.

In the image data streaming mode, as shown in FIG. 33, the switches SW1 and SW2 are ON and the switches SW3 and SW4 are OFF. The data which are obtained by parallel-to-serial conversion of the image data comprised of a plurality of bits by the serializer are driven by the differential output circuit 351 and are output from the input/output terminals PIN1 and PIN2.

In the solid-state imaging device 100G, as shown in FIG. 34, the system after turning on the power is reset by the power-on reset, whereby the operation enters into the register control mod. Phase adjustment etc. of internal pulses are executed from the outside until the mode ends. After receiving a mode ending command, the operation enters the image data streaming mode. The data obtained by parallel-to-serial conversion for converting the image data comprised of a plurality of bits from parallel data to serial data at the serializer 342 are driven by the differential output circuit 351 and are output from the input/output terminals (control pins) PIN1 and PIN2.

In this way, in the eighth embodiment, for example, the parallel output signal pins are combined to form a single system of output pins. Further, it becomes possible to further decrease the pins which are necessary for driving by sharing the pin driving pulse input pin and output signal-use pin, by setting the external driving pulse as MCLK (reference clock), and by using them as output and control-use pins (PIN1 and PIN2).

According to the eighth embodiment, in addition to the same effects as the effects by the seventh embodiment explained above, the following effects can be obtained. That is, according to the eighth embodiment, the number of drive pins can be further decreased. Therefore, by arranging the peripheral circuit on the second substrate 120G, there is the advantage that imaging device can be applied to an electronic apparatus which is used for an application restricted as to mounting size, number of connectable cables, cable lengths, installation heights, and so on in view of requirements for installation of the camera such as, for example, a monitoring camera, medical endoscope-use camera, or the like.

The solid-state imaging devices 100 and 100A to 100G explained above can be applied as imaging devices to digital cameras and video cameras, mobile terminals, or monitoring cameras, medical endoscope-use cameras or other electronic apparatuses.

Ninth Embodiment

Figure 35:
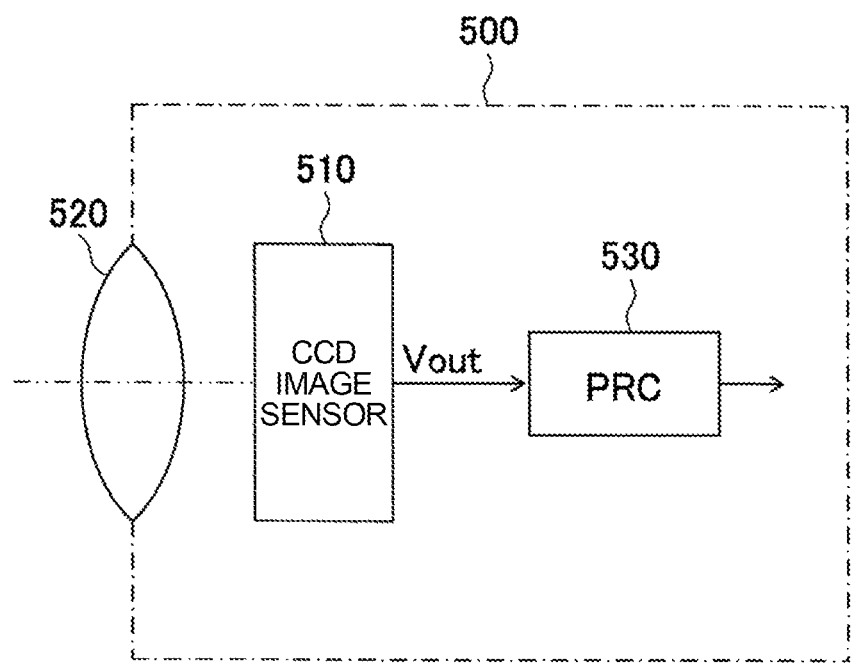
FIG. 35 is a view showing an example of the configuration of an electronic apparatus having a camera system mounted thereon to which the solid-state imaging device according to the embodiment of the present invention is applied.

FIG. 35 is a view showing an example of the configuration of an electronic apparatus mounting a camera system in which the solid-state imaging device according to an embodiment of the present invention is applied to the camera system.

The present electronic apparatus 500, as shown in FIG. 35, has a CCD/CMOS stacked type solid-state imaging device 510 according to the present invention to which the solid-state imaging devices 100 and 100A to 100G according to the present embodiment can be applied. Further, the electronic apparatus 500 has an optical system (lens etc.) for guiding the incident light (forming the subject image) into the pixel region of this CCD/CMOS stacked type solid-state imaging device 510. The electronic apparatus 500 has a signal processing circuit (PRC) 530 for processing the output signal of the CCD/CMOS stacked type solid-state imaging device 510.

The signal processing circuit 530 applies predetermined signal processing with respect to the output signal of the CCD/CMOS stacked type solid-state imaging device 510. The image signal processed in the signal processing circuit 530 is projected as a moving picture on a monitor configured by a liquid crystal display or the like or can be output to a printer. Further, it may be directly stored in a memory card or another storage medium. Various embodiments are possible As explained above, by mounting the solid-state imaging devices 100 and 100A to 100G explained before as the CCD/CMOS stacked type solid-state imaging device 510, it becomes possible to provide a high performance, small-sized, and low cost camera system. Further, it is possible to realize an electronic apparatus which is used for an application restricted as to mounting size, number of connectable cables, cable lengths, installation heights, and so on in view of requirements for installation of the camera such as, for example, a monitoring camera, medical endoscope-use camera, or the like.

REFERENCE SIGNS LIST 100, 100A to 100G . . . solid-state imaging devices, 110, 110A to 110F . . . first substrates, 120, 120A to 120F . . . second substrates, 200 . . . imaging element part, 210 . . . photosensitive part (imaging part), 211 . . . pixel portion, 212-1 to 212-8 . . . charge transfer parts (vertical transfer parts, VCCD), 213-1 to 213-4 . . . output end parts, 220, 220-1 to 220-8 . . . charge storage parts (storage parts), 230 . . . output part, 240 . . . relay part, 241, 141A . . . through-vias (TSV, connecting parts), 250 . . . relay selecting part, 260 . . . output selecting part, 270 . . . sensor core, 300 . . . signal processing part (signal processing and power supply portion), 310 . . . FPGA, TG, 320 . . . image processing circuit (image processing IC), 330 . . . power supply circuit (power supply IC), 341 . . . ADC, 342 . . . serializer, 343 . . . memory, 344 . . . timing generator (TG), 345 . . . DCDC converter (DCDC), 346 . . . memory, 350 . . . sharing circuit, 351 . . . differential output circuit, 353 . . . register controller, SW1 to SW4 . . . switches, 500 electronic apparatus, 510 . . . CCD/CMOS stacked type solid-state imaging device, 520 . . . optical system, and 530 . . . signal processing circuit (PRC).

The invention claimed is:

1. A solid-state imaging device comprising:
a photosensitive part including a plurality of photoelectric conversion elements which are arranged in a matrix and a plurality of charge transfer circuits which transfer signal charges of the plurality of photoelectric conversion elements in unit of columns or rows,
a plurality of charge storage circuits for storing signal charges which are transferred by the plurality of charge transfer circuits in the photosensitive part,
a plurality of relay circuits which relay transfer of the signal charges transferred by the plurality of charge transfer circuits in the photosensitive part to the plurality of charge storage circuits,
a plurality of output circuits for outputting the signal charges stored in the plurality of charge storage circuits as electrical signals,
a first substrate on which the photosensitive part is formed, and a second substrate on which the plurality of charge storage circuits and the plurality of output circuits are formed, wherein at least the first substrate and the second substrate are stacked, the plurality of relay circuits electrically connect the plurality of charge transfer circuits formed on the first substrate and the plurality of charge storage circuits formed on the second substrate by connecting parts passing through the substrates outside of a photosensitive region in the photosensitive part, and the photosensitive region includes all of the plurality of photoelectric conversion elements and a portion of the plurality of charge transfer circuits, wherein the plurality of relay circuits connect the plurality of charge transfer circuits formed on the first substrate and the plurality of charge storage circuits formed on the second substrate by through-vias outside of the photosensitive region in the photosensitive part, and wherein, when transferring the charges from the plurality of charge transfer circuits to the plurality of charge storage circuits through the through-vias, the through-vias are set at an intermediate potential.

2. The solid-state imaging device according to claim 1, wherein:

on the second substrate, one end part of each of the plurality of charge storage circuits forms an input end part, and another end part forms an output end part which is connected to each of the plurality of output circuits and the plurality of relay circuits electrically connect the output end part of the plurality of charge transfer circuits which are positioned outside of the photosensitive region and the input end parts of the plurality of charge storage circuits by the connecting parts.

3. The solid-state imaging device according to claim 1, wherein the plurality of relay circuits include a relay selecting circuit for selectively connecting the plurality of charge transfer circuits and the plurality of charge storage circuits.

4. The solid-state imaging device according to claim 3, wherein the relay selecting circuit is configured to perform addition or thinning of the signal charges of parallel plurality of charge transfer circuits.

5. The solid-state imaging device according to claim 1, wherein the second substrate includes an output selecting circuit for selectively connecting the plurality of charge storage circuits and the plurality of output circuits.

6. The solid-state imaging device according to claim 5, wherein the output selecting circuit is configured to perform addition or thinning of the signal charges of parallel plurality of charge storage circuits.

7. The solid-state imaging device according to claim 1, wherein the first substrate is formed by a first conductivity type substrate, and the second substrate is formed by a second conductivity type substrate.

8. The solid-state imaging device according to claim 1, wherein the first substrate is formed by an n-type substrate or n-well and has a vertical type overflow drain structure.

9. The solid-state imaging device according to claim 1, wherein on the second substrate, at least, an analog-to-digital converter (ADC) for processing the output signals of the plurality of output circuits and a serializer for converting the image data comprised of a plurality of bits from parallel data to serial data are formed.

10. The solid-state imaging device according to claim 9, wherein on the second substrate, a voltage generation circuit and driving pulse generator are formed.

11. The solid-state imaging device according to claim 9, wherein on the second substrate, a means for sharing terminals for driving pulses and output signal pulses is formed.

12. An electronic apparatus comprising:

a solid-state imaging device, an optical system of forming an image in a photosensitive part in the solid-state imaging device, and a signal processing part for processing output signals of the solid-state imaging device, wherein the solid-state imaging device has the photosensitive part including a plurality of photoelectric conversion elements which are arranged in a matrix and a plurality of charge transfer circuits which transfer signal charges of the plurality of photoelectric conversion elements in unit of columns or rows, a plurality of charge storage circuits for storing signal charges which are transferred by the plurality of charge transfer circuits in the photosensitive part, a plurality of relay circuits which relay transfer of the signal charges transferred by the plurality of charge transfer circuits in the photosensitive part to the charge storage circuits, a plurality of output circuits for outputting the signal charges stored in the plurality of charge storage circuits as electrical signals, a first substrate on which the photosensitive part is formed, and a second substrate on which the plurality of charge storage circuits and the plurality of output circuits are formed, wherein at least the first substrate and the second substrate are stacked, the plurality of relay circuits electrically connect the plurality of charge transfer circuits formed on the first substrate and the plurality of charge storage circuits formed on the second substrate by connecting parts passing through the substrates outside of a photosensitive region in the photosensitive part, and the photosensitive region includes all of the plurality of photoelectric conversion elements and a portion of the plurality of charge transfer circuits, wherein the plurality of relay circuits connect the plurality of charge transfer circuits formed on the first substrate and the plurality of charge storage circuits formed on the second substrate by through-vias outside of the photosensitive region in the photosensitive part, and wherein, when transferring the charges from the plurality of charge transfer circuits to the plurality of charge storage circuits through the through-vias the through-vias are set at an intermediate potential.

* * * * *